(12) United States Patent
Ashikaga

(10) Patent No.: US 6,198,654 B1
(45) Date of Patent: Mar. 6, 2001

(54) FERROELECTRIC MEMORY DEVICE AND METHOD OF READING DATA THEREFROM

(75) Inventor: Kinya Ashikaga, Tokyo (JP)

(73) Assignee: Oki Electric Industry, Co., Ltd. (JP)

( * ) Notice: Subject to any disclaimer, the term of this patent is extended or adjusted under 35 U.S.C. 154(b) by 0 days.

(21) Appl. No.: 09/597,728

(22) Filed: Jun. 19, 2000

(30) Foreign Application Priority Data

Sep. 2, 1999 (JP) .................................................. 11-248810

(51) Int. Cl.$^7$ .................................................. G11C 11/22
(52) U.S. Cl. ............................................ 365/145; 365/149
(58) Field of Search ..................................... 365/145, 149

(56) References Cited

U.S. PATENT DOCUMENTS 6,097,624 * 8/2000 Chung et al. .......................... 365/145

* cited by examiner

*Primary Examiner*—Huan Hoang
(74) *Attorney, Agent, or Firm*—Venable; Robert Frank; James R. Burdett

(57) ABSTRACT

Since the ferroelectric memory device is a 1T1C type, the size of one memory cell can be smaller than that of a 2T2C type. In this ferroelectric memory device, the reference potential does not have to be generated when data is read.

16 Claims, 12 Drawing Sheets

FERROELECTRIC MEMORY DEVICE AND METHOD OF READING DATA THEREFROM

BACKGROUND OF THE INVENTION

1. Field of the Invention

The present invention relates to a ferroelectric memory device, and more particularly to a device structure of a non-volatile memory using a ferroelectric thin film and a method of reading data from this ferroelectric memory device.

2. Description of Related Art

One example of ferroelectric memory devices which have been proposed is one having a cell structure comprised of transistors and a stored capacitance element (capacitor). This stored capacitance element is called a "ferroelectric capacitor" since ferroelectric film is used. As such a ferroelectric memory cell, the 1T1C type, where one memory cell is comprised of one transistor and one ferroelectric capacitor, and the 2T2C type, where one memory cell is comprised of two transistors and two ferroelectric capacitors are known.

Now, the operation principle of the 1T1C type ferroelectric memory device will be briefly described with reference to FIG. 12. FIG. 12 is a circuit diagram of a conventional 1T1C memory device.

One memory cell 100, which is comprised of one transistor 102 and one ferroelectric capacitor 104, is positioned at the intersection between the word line (WL) and the bit line (BL). One electrode of the ferroelectric capacitor 104 is connected to BL via the transistor 102 which turns the connection with BL ON and OFF, that is, via the main current path of this transistor 102. The other electrode of the ferroelectric capacitor is connected to a plate line (PL). BL is also connected to a sense amplifier 106.

The stored information is stored to be one of the two states of the ferroelectric capacitor 104 with respect to the applied voltage 0V. For example, in the above mentioned ferroelectric memory device, if one memory cell 100 is selected by WL, BL is set to the ground potential (0V), and a positive voltage is applied to PL, then the polarization direction of the ferroelectric capacitor 104 becomes a first direction. This state is stored as information "0". If the memory cell 100 is selected, a positive voltage is applied to BL, and PL is set to 0, then the polarization direction of the ferroelectric capacitor 104 becomes a second direction, which is the opposite direction of the first direction. This state is stored as information "1".

A method of reading data in such an 1T1C memory cell will now be described.

For the data reading operation, BL of the target memory cell 100 is pre-charged to the ground potential (0V) first, then a positive voltage is applied to PL. If the ferroelectric capacitor 104 is polarized in the second direction, that is the (←) direction, the polarization direction of the ferroelectric capacitor 104 is inverted by this reading operation. If the ferroelectric capacitor 104 is polarized in the first direction, that is the (→) direction, on the other hand, polarization inversion is not caused by this reading operation. During these reading operations, the potential of BL changes according to the polarization state of the ferroelectric capacitor 104 when the data was written. This potential is output as a different potential $V_1$ or $V_0$ by the sense amplifier 106. For example, the potential of $V_1$ is higher than $V_0$.

To determine these signals by the sense amplifier 106, the reference potential (also called "reference signal") $V_{ref}$ must be input to the sense amplifier 106.

If the reference potential $V_{ref}$ is an intermediate potential of $V_1$ and $V_0$, and if the potential of BL is higher than $V_{ref}$ in the sense amplifier 106, this means that $V_1$, that is, the stored information of the ferroelectric capacitor 104, is "1". If the potential of BL is lower than $V_{ref}$, this means that $V_0$, that is, the stored information, is "0".

A dummy cell method is normally used to generate such reference potential $V_{ref}$. In the case of the configuration in FIG. 12, a memory cell 108 having a similar structure as the memory cell 100 is disposed as a dummy cell. This dummy cell 108 has one transistor 110 and one ferroelectric capacitor 112. The dummy cell 108 is disposed at the intersection between a bit complementary line (/BL) connected to the sense amplifier 106 and a word line for dummy cell (D-WL). One electrode of the ferroelectric capacitor 112 is connected to /BL via a transistor 110 which turns the connection with /BL ON and OFF, that is, via the main current path of this transistor 110. The other electrode of the ferroelectric capacitor 112 is connected to a plate line for dummy cell (D-PL). It is necessary, however, that the stored capacitance of the ferroelectric capacitor 112 of the dummy cell 108 be set to a capacitance which is different from the ferroelectric capacitor 102 of the original memory cell 100, so that the reference potential ($V_{ref}$) generated in /BL becomes a voltage value (set value) between $V_1$ and $V_0$.

The dummy cell 108, however, is always used to read data from the ferroelectric memory device no matter which memory cell is selected. Therefore, the ferroelectric film constituting the ferroelectric capacitor 112 of the dummy cell 108 tends to have "fatigue phenomena", such as where the polarization quantity changes while repeating polarization inversion (fatigue) or where the hysteresis characteristic shifts by a unipolar pulse (imprinting) These fatigue phenomena may cause the reference potential from the dummy cell to deviate from the above mentioned set value. Because of this, a conventional ferroelectric memory device has the problem where the possibility of reading errors is high.

When a 2T2C type memory cell is used, the memory cell is comprised of an original memory cell and a complementary memory cell for writing data so that a complementary signal of the signal from the original memory cell is input to the sense amplifier.

When the data is read, the signal from the original memory cell and the complementary signal from the complementary memory cell are input to the sense amplifier, so the reading margin is about two times that of an 1T1C type memory cell. Therefore, in the case of this type of ferroelectric memory device, the possibility of reading errors decreases. Also, the ferroelectric films of two capacitors (original cell and complementary cell) in one memory cell deteriorate at an equal rate, since the same number of times of writing is executed. Therefore, in the case of a 2T2C type memory device, operation is more stable than a 1T1C type memory device where deterioration of ferroelectric film of a dummy cell is more conspicuous.

However, in the case of 2T2C, a high integration of a ferroelectric memory device is impossible since the size of a memory cell is larger than that of the 1T1C type. Therefore, in terms of shrinking cell size, the 1T1C type is preferable.

SUMMARY OF THE INVENTION

With the foregoing in view, the first object of the present invention is to provide a ferroelectric memory device which cell size is smaller than the 2T2C type so that high integration is possible.

The second object of the present invention is to provide a method of reading data from such a ferroelectric memory device without any reading errors.

To achieve the above first object, a ferroelectric memory device of the present invention has the following unique configuration. That is, the ferroelectric memory device of the present invention comprises at least one memory cell, a word line, a first bit line, a second bit line, a capacitor, a sub-bit line and a sense amplifier. According to the present invention, the memory cell further comprises one ferroelectric capacitor and a first transistor where one end of a main current path is connected to one electrode of the ferroelectric capacitor. Also, according to the present invention, the word line is connected to a control electrode of the first transistor. Also, according to the present invention, the first bit line is connected to the other end of the main current path of the first transistor. Also, according to the present invention, the second bit line is connected to the other electrode of the ferroelectric capacitor. Also, according to the present invention, the capacitor is connected to the first bit line. Also, according to the present invention, the sub-bit line is connected to the electrode of the capacitor at the side which is not connected to the first bit line. Also, according to the present invention, the sense amplifier detects which one of the potentials of the sub-bit line and the second bit line is higher or lower.

In this way, this ferroelectric memory device has the 1T1C type configuration, therefore the size of one memory cell can be smaller than the size of the memory cell of the 2T2C type device. Also, in the above mentioned ferroelectric memory device, it is unnecessary to generate a reference potential when data is read, therefore, a means for generating a reference potential need not be disposed. This allows high integration in a similar degree to a DRAM, which is generally regarded as a high integration memory device.

For the embodiment of the present invention, it is preferable that the other electrode of the ferroelectric capacitor and the second bit line are connected via a main current path of a second transistor, and a control electrode of the second transistor is connected to the word line.

Connecting the second transistor between the ferroelectric capacitor and the second bit line adds one more transistor to the composing elements of the memory cell, but the cell size can be smaller than that of the 2T2C type ferroelectric memory device. This means that higher integration than the 2T2C type ferroelectric memory device is possible. Also, connecting the second transistor decreases the capacitance of the second bit line. This means that controllability of the second bit line improves and the second bit line can be operated faster. The transistor mentioned here has a control electrode (e.g. gate electrode) and two main electrodes (e.g. source electrode and drain electrode). The main current path is a current path between these two main electrodes.

In such a ferroelectric memory device where the first bit line and the sub-bit line are connected via the capacitor, the capacitance of the first bit line is defined as the first bit line capacitance $C_{B1}$, the capacitance of the second bit line is defined as the second bit line capacitance $C_{B2}$, the capacitance of the capacitor is defined as the capacitor capacitance $C_X$, and the capacitance of the sub-bit line is defined as the sub-bit line capacitance $C_{BS}$. And when the data is read from the memory cell, the first bit line, the second bit line and the sub-bit line are set to be the same potential, and then the first bit line is pre-charged such that the potential difference between the first bit line and the second bit line becomes a voltage for measurement V. Next the first bit line, the second bit line and the sub-bit line are electrically floated. Then the word line is activated so that the electric charge quantity $\Delta Q$ of the electric charge is transferred from the first bit line to the second bit line via the ferroelectric capacitor. At this time, if the above mentioned electric charge quantity when the polarization inversion of the ferroelectric capacitor is accompanied is defined as $\Delta Q_1$, and the above mentioned electric charge quantity when the polarization inversion of the ferroelectric capacitor is not accompanied is defined as $\Delta Q_0$, then it is preferable that the first bit line capacitance $C_{B1}$, the second bit line capacitance $C_{B2}$, the capacitor capacitance $C_X$ and sub-bit line capacitance $C_{BS}$ are determined so as to satisfy the following formula (1).

$$V/\Delta Q_1 < 1/C_{Bt} + 1/C_{B2} + C_{BS}/(C_{B2} \cdot C_X) < V/\Delta Q_0 \tag{1}$$

Here the $C_{Bt}$ in the formula (1) is $C_{Bt} = C_{B1} + (1/C_X + 1/C_{BS})^{-1}$.

If the ferroelectric memory device is constituted determining $C_{B1}$, $C_{B2}$, $C_X$ and $C_{BS}$ so as to satisfy the above formula (1), the direction of the polarization of the ferroelectric substance as a data can be judged easily without using a reference potential, by comparing the potential of the sub-bit line and the potential of the second bit line using the sense amplifier when the data is read.

Another ferroelectric memory device of the present invention comprises at least one memory cell, a word line, a first bit line, a second bit line, a switch transistor, a sub-bit line, and a sense amplifier. According to the present invention, the memory cell further comprises one ferroelectric capacitor and a first transistor where one end of a main current path is connected to one electrode of the ferroelectric capacitor. Also, according to the present invention, the word line is connected to a control electrode of the first transistor. Also, according to the present invention, the first bit line is connected to the other end of the main current path of the first transistor. Also, according to the present invention, the second bit line is connected to the other electrode of the ferroelectric capacitor. Also, according to the present invention, one end of the main current path of the switch transistor is connected to the first bit line. Also, according to the present invention, the sub-bit line is connected to the other end of the main current path of the switch transistor. Also, according to the present invention, the sense amplifier detects which one of the potentials of the sub-bit line and the second bit line is higher or lower.

In this way, this ferroelectric memory device has the 1T1C type configuration, therefore the size of one memory cell can be smaller than the size of the memory cell of the 2T2C type device. Also, in the above mentioned ferroelectric memory device, it is unnecessary to generate a reference potential when data is read, therefore, a means for generating a reference potential need not be disposed. This allows high integration in a similar degree to a DRAM, which is generally regarded as a high integration memory device.

In the above mentioned ferroelectric memory device where the first bit line and the sub-bit line are connected via the main current path of the switch transistor, it is preferable that the other electrode of the ferroelectric capacitor and the second bit line are connected via a main current path of a second transistor, and a control electrode of the second transistor is connected to the word line.

Connecting the second transistor between the ferroelectric capacitor and the second bit line adds one more transistor to the composing elements of the memory cell, but the cell size can be smaller than that of the 2T2C type ferroelectric memory device. This means that higher integration than the 2T2C type ferroelectric memory device is possible. Also connecting the second transistor decreases the capacitance of the second bit line. This means that the controllability of the second bit line improves and the second bit line can be operated faster.

In such a ferroelectric memory device where the switch transistor is disposed between the first bit line and the sub-bit line, the capacitance of the first bit line is defined as the first bit line capacitance $C_{B1}$, the capacitance of the second bit line is defined as the second bit line capacitance $C_{B2}$, and the capacitance of the sub-bit line is defined as the sub-bit line capacitance $C_{BS}$. And when the data is read from the memory cell, the first bit line, the second bit line and the sub-bit line are set to be the same potential, and then the switch transistor is deactivated. In this state, the first bit-line is pre-charged such that the potential difference between the first bit line and the second bit line become a voltage for measurement V, then the first bit line, the second bit line and the sub-bit line are electrically floated. Then the word line is activated, so that the electric charge quantity $\Delta q$ of the electric charge is transferred from the first bit line to the second bit line via the ferroelectric capacitor. At this time, if the electric charge quantity when the polarization inversion of the ferroelectric capacitor is accompanied is defined as $\Delta q_1$, and if the electric charge quantity when the polarization inversion of the ferroelectric capacitor is not accompanied is defined as $\Delta q_o$, then the first bit line capacitance $C_{B1}$, the second bit line capacitance $C_{B2}$ and the sub-bit line capacitance $C_{BS}$ are determined so as to satisfy the following formula (2).

$$V/\Delta q_1 < (K/C_{B2}+1/C_{B1}) < V/\Delta q_0 \quad (2)$$

Here, K in the formula (2) is $K=1+C_{BS}/C_{B1}$.

If the ferroelectric memory device is constituted determining $C_{B1}$, $C_{B2}$ and $C_{BS}$ so as to satisfy the above formula (2), the direction of the polarization of the ferroelectric substance as a data can be judged easily without using a reference potential, by comparing the potential of the sub-bit line and the potential of the second bit line using the sense amplifier when the data is read.

To achieve the second object, a data reading method of the present invention used to read when data of a memory cell where writing is completed from a ferroelectric memory device comprising at least one memory cell further comprising one ferroelectric capacitor and a first transistor where one end of a main current path is connected to one electrode of the ferroelectric capacitor, a word line connected to a control electrode of the first transistor, a first bit line connected to the other end of the main current path of the first transistor, a second bit line connected to the other electrode of the ferroelectric capacitor, a capacitor connected to the first bit line, a sub-bit line connected to the side not connected to the first bit line of the capacitor, and a sense amplifier which detects which one of the potentials of the sub-bit line and the second bit line is higher or lower, comprises the following steps (1)–(4).

(1) a step of setting the first bit line, the second bit line and the sub-bit line to be the same potential,
(2) a step of pre-charging the first bit line such that the potential difference between the first bit line and the second bit line become the voltage for measurement, then electrically floating the first bit line, the second bit line and the sub-bit line,
(3) a step of activating the word line,
(4) a step of activating the sense amplifier and detecting which one of the potentials of the sub-bit line and the second bit line is higher or lower.

At first, in step (1), the first bit line, the second bit line and the sub-bit line are set to be the same potential, for example, to the ground potential.

Then in Step (2), the first bit line is pre-charged, for example, to the power supply potential Vcc (in this description, it is assumed that Vcc>0). By this, the potential difference between the first bit line and the second bit line becomes Vcc. This Vcc is regarded as the voltage for measurement. By pre-charging the first bit line, electric charges are stored in the sub-bit line and the capacitor. Then the first bit line, the second bit line and the sub-bit line are electrically floated.

When the word line is activated in step (3), the first transistor is turned ON. By this, a part of the electric charges stored in the first bit line, the capacitor and the sub-bit line are transferred to the ferroelectric capacitor. Also, the same quantity of electric charges as the electric charges transferred from the first bit line to the ferroelectric capacitor transfers from the ferroelectric capacitor to the second bit line. Therefore, at this point, the potentials of the first bit line and the sub-bit line decrease, and the potential of the second bit line increases. The change of the electric charge quantity differs depending on the polarization direction (polarization state) of the ferroelectric capacitor. This is due to the hysteresis characteristic of the ferroelectric substance.

Then the sense amplifier is activated in step (4). The sub-bit line and the second bit line are connected to the sense amplifier. When the quantity of electric charge transferred from the first bit line to the ferroelectric capacitor is high, the potential of the sub-bit line is lower than the potential of the second bit line which potential is increased by the electric charge transfer. The potential of the first bit line is lowered due to the electric charge transfer, but is still higher than the potential of the second bit line. When the quantity of the electric charges transferred from the first bit line to the ferroelectric capacitor is low, the potential of the sub-bit line is higher than the potential of the second bit line. At this time, the potential of the first bit line is much higher than the potential of the second bit line. Therefore, the polarization direction of the ferroelectric substance is different depending on whether the potential of the sub-bit line is higher or lower than the potential of the second bit line. So, the polarization direction of the ferroelectric substance can be judged by comparing the potential of the sub-bit line and the potential of the second bit line after activating the sense amplifier.

When the polarization direction of the ferroelectric capacitor is inverted after the detection step by the sense amplifier, it is preferable to include a step of restoring the polarization direction using the output potential from the sense amplifier.

When the quantity of electric charges transferred from the first bit line to the ferroelectric capacitor is high at reading, the data is read after inverting the polarization of the ferroelectric substance. In this case, the output potential of the second bit line is output, for example, as Vcc, and the output potential of the sub-bit line is output, for example, as ground potential respectively by the sense amplifier. In this state, information of the memory cell which was read is destroyed. So the output potential (Vcc) of the second bit line is returned to the potential of the second bit line using a latch type sense amplifier, since the potential difference between the second bit line and the sub-bit line is a voltage by which writing is possible. By this, voltage (Vcc) is applied between both electrodes of the ferroelectric capacitor. As a result, the polarization direction can be returned to the state before reading. This means that restoring is possible. When the quantity of the electric charges transferred from the first bit line to the ferroelectric capacitor is low, data is read from the ferroelectric capacitor without accompanying polarization inversion. At this time, the output potential of the second bit line is the ground potential, and the output potential of the sub-bit line is Vcc. In this case, voltage in the same direction as the direction of polarization is applied to the ferroelectric substance even if the output of the second bit line is returned to the potential of the second bit line, therefore this does not destroy data.

The above mentioned data read method is also applied to a ferroelectric memory device where the other electrodes of the ferroelectric capacitor and the second bit line are connected via the main current path of the second transistor.

Another data reading method of the present invention used to read data of a memory cell where writing is completed from a ferroelectric memory device comprising at least one memory cell further comprising one ferroelectric capacitor and a first transistor where one end of a main current path is connected to one electrode of the ferroelectric capacitor, a word line connected to a control electrode of the first transistor, a first bit line connected to the other end of the main current path of the first transistor, a second bit line connected to the other electrode of the ferroelectric capacitor, a switch transistor connected to the first bit line, a sub-bit line connected to the side not connected to the first bit line of the switch transistor, and a sense amplifier which detects which one of the potentials of the sub-bit line and the second bit line is higher or lower, comprising the following steps (1)–(5).

(1) a step of setting the first bit line, the second bit line and the sub-bit line to be the same potential, (2) a step of pre-charging the first bit line such that the potential difference between the first bit line and the second bit line become the voltage for measurement, then electrically floating the first bit line, the second bit line and the sub-bit line, (3) a step of activating the word line, (4) a step of activating the switch transistor after deactivating the word line, (5) a step of activating the sense amplifier and detecting which one of the potentials of the sub-bit line and the second bit line is higher or lower.

At first, in step (1), the first bit line, the second bit line and the sub-bit line are set to be the same potential, for example, to the ground potential.

Then in step (2), the first bit line is pre-charged, for example, to the power supply potential Vcc (in this description, it is assumed that Vcc>0). By this, the potential difference between the first bit line and the second bit line becomes Vcc. Then the first bit line, the second bit line and the sub-bit line are electrically floated.

When the word line is activated in step (3), the first transistor is turned ON. Then a part of the electric charges stored in the first bit line transfer to the ferroelectric capacitor. Responding to this, electric charges transfer from the ferroelectric capacitor to the second bit line. At this point, the potential of the first bit line decreases and the potential of the second bit line increases. The change of the electric charge quantity differs depending on the polarization direction of the ferroelectric capacitor. When the change of the electric charge quantity is high, the polarization of the ferroelectric substance is inverted by this electric charge transfer. And when the change of the electric charge quantity is low, the polarization of the ferroelectric substance is not inverted.

When the switch transistor is activated after deactivating the word line in step (4), a part of the electric charges remained in the first bit line transfer to the sub-bit line. And the potentials of the first bit line and the sub-bit line become equal. Since the word line is inactive, the potential of the second bit line is still floated.

Then the sense amplifier is activated in step (5). The sub-bit line and the second bit line are connected to the sense amplifier. Since the potential of the sub-bit line is equal to the potential of the first bit line at the point of step (4), the potential of the sub-bit line to be output from the sense amplifier substantially indicates the potential of the first bit line. When the quantity of electric charges transferred from the first bit line to the ferroelectric capacitor is high in step (3), more electric charges transfer from the first bit line to the sub-bit line in the step (4), so, the potential to be output is lower than that of the second bit line. When the quantity of the electric charges transferred from the first bit line to the ferroelectric capacitor is low in step (3), the potential of the sub-bit line (that is, the potential of the first bit line) to be detected by the sense amplifier is higher than the potential of the second bit line, even if the electric charges transfer from the first bit line to the sub-bit line in the step (4). Therefore, the polarization direction of the ferroelectric capacitor can be judged by comparing the potential of the sub-bit line and the potential of the second bit line.

When the polarization direction of the ferroelectric capacitor is inverted after the detection step (step (5)) by the sense amplifier, it is preferable to include a step of restoring the polarization direction using the output potential from the sense amplifier by activating the word line.

When the quantity of the electric charges transferred from the first bit line to the ferroelectric capacitor is high when the data is read, the polarity of the ferroelectric substance is inverted, as mentioned above. After this, the output potential of the second bit line to be output from the sense amplifier is the power supply potential Vcc because of the amplification. The output potential of the sub-bit line is the ground potential. Here, the word line is activated again so that the output potential is returned from the sense amplifier to the second bit line. Since the polarization direction of the ferroelectric capacitor can be inverted again by this output potential, the polarization direction can be restored to the state before reading data. When the quantity of the electric charges transferred from the first bit line to the ferroelectric capacitor is low in step (3), the ferroelectric capacitor is read without polarization inversion. For the output from the sense amplifier, the output potential of the second bit line is the ground potential, and the output potential of the sub-bit line is Vcc. In this case, even if the output of the second bit line is returned to [the potential of] the second bit line, voltage in the same direction as the polarization is applied to the ferroelectric substance, therefore data is not destroyed.

The above mentioned data reading method can also be applied to the ferroelectric memory device where the other electrode of the ferroelectric capacitor and the second bit line are connected via the main current path of the second transistor.

By this, when the data is read from a 1T1C or 2T1C type ferroelectric memory device, data can easily be read with less steps without using a reference potential and without reading errors. When reading data accompanies polarization inversion of the ferroelectric substance, the ferroelectric substance can be restored using the output potential from the sense amplifier, therefore data is not destroyed.

BRIEF DESCRIPTION OF THE DRAWINGS

The foregoing and other objects, features and advantages of the present invention will be better understood from the following description taken in connection with the accompanying drawings in which.

DESCRIPTION OF THE PREFERRED EMBODIMENTS

Embodiments of the present invention will now be described with reference to the accompanying drawings. In each drawing, the shape, size and configuration of each composing element are roughly shown merely to help understand the invention, and the present invention is not restricted by the illustrated examples.

First Embodiment

Figure 1:
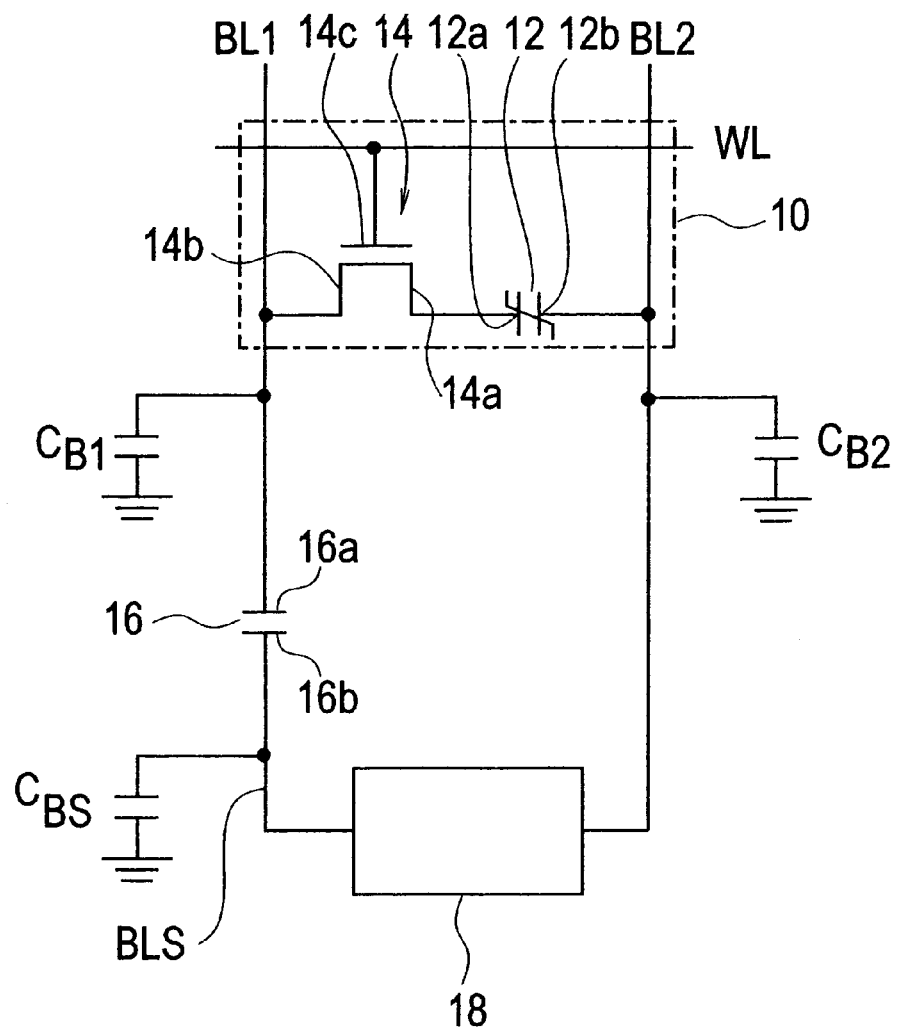
FIG. 1 is a circuit diagram depicting a configuration of a ferroelectric memory device to be used for description of the first embodiment.
Figure 2:
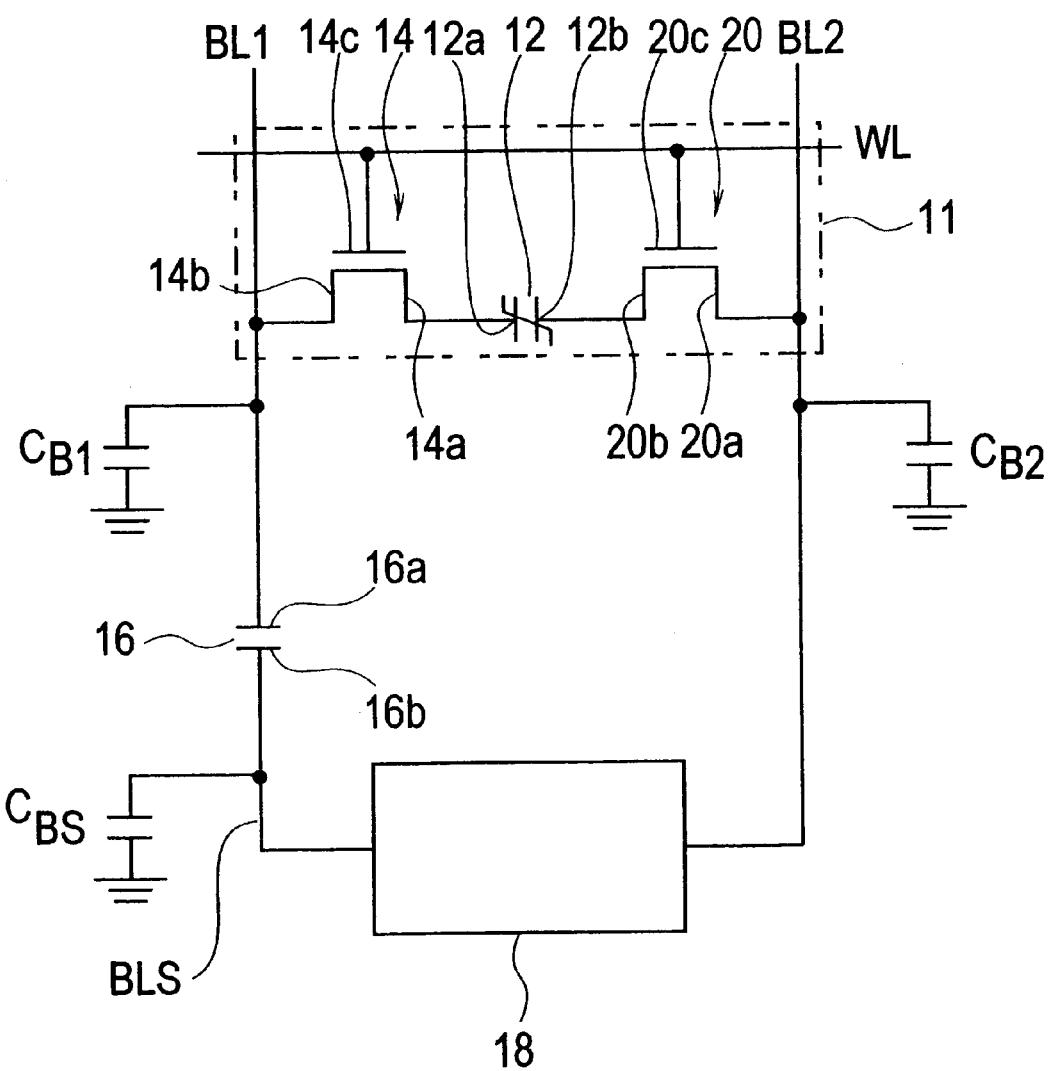
FIG. 2 is a circuit diagram depicting a configuration of a ferroelectric memory device to be used for description of the first embodiment.
Figure 3:
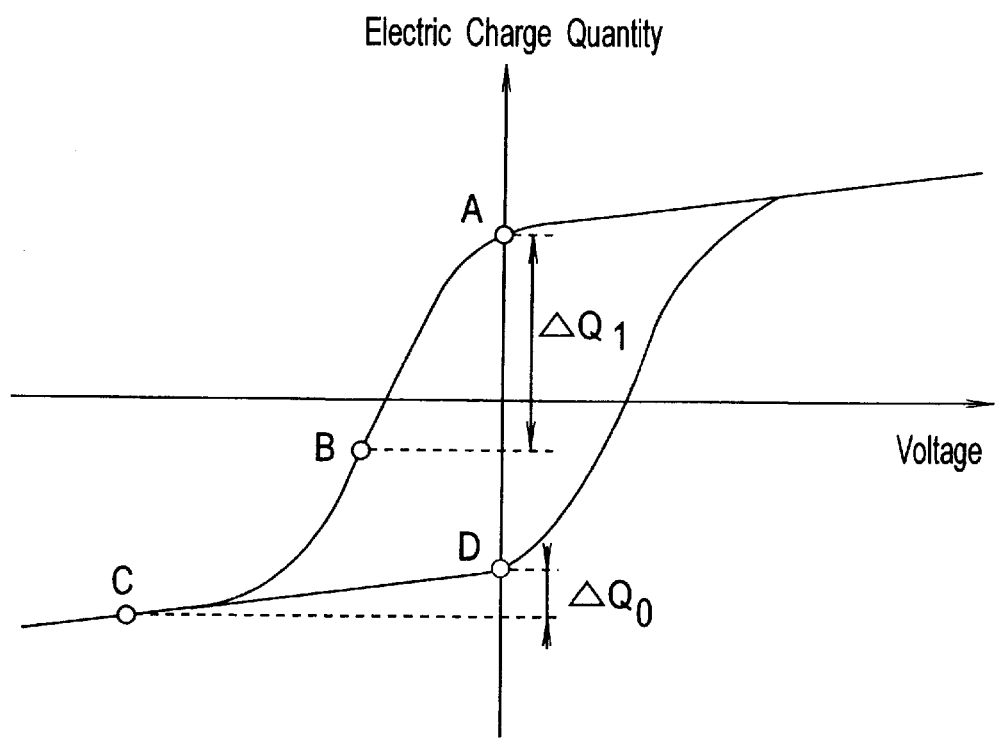
FIG. 3 is a characteristic diagram depicting a hysteresis characteristic of the ferroelectric capacitor.

The structure and data reading method of the ferroelectric memory device in accordance with the first embodiment will now be described with reference to FIG. 1 to FIG. 4. FIG. 1 and FIG. 2 are circuit diagrams depicting a configuration of the ferroelectric memory device of the present embodiment. FIG. 3 is a hysteresis characteristic diagram of the ferroelectric capacitor.

According to FIG. 1, one memory cell 10 is comprised of one ferroelectric capacitor 12 and a first transistor 14. One end of the main current path of the first transistor 14, that is, a first main electrode, such as a drain electrode 14a, is connected to one electrode 12a of the ferroelectric capacitor 12. The ferroelectric memory device comprises at least one memory cell 10 mentioned above, a word line WL, a first bit line BL1, a second bit line BL2, a capacitor 16, a sub-bit line BLS, and a sense amplifier 18. The above mentioned word line WL is connected to a control electrode (gate) 14c of the first transistor 14. The above mentioned first bit line BL1 is connected to the other end of the main current path of the first transistor 14, that is, the second main electrode, such as a source electrode 14b. The above mentioned second bit line BL2 is connected to the other electrode 12b of the ferroelectric capacitor 12. One electrode 16a of the above mentioned capacitor 16 is connected to the first bit line BL1. The above mentioned sub-bit line BLS is connected to an electrode 16b at the side which is not connected to the first bit line BL1 of the capacitor 16. The above mentioned sense amplifier 18 is connected between the sub-bit line BLS and the second bit line BL2, so as to detect which one of the potentials of the bit lines BLS and BL2 is higher or lower.

The capacitance $C_{B1}$ of the above mentioned first bit line BL1, the capacitance $C_{B2}$ of the second bit line BL2, the capacitance $C_X$ of the capacitor 16, and the capacitance $C_{BS}$ of the sub-bit line BLS are determined as follows.

At first, the potentials of the first bit line BL1, the second bit line BL2 and the sub-bit line BLS are set to the ground potential in advance. Then BL1 is pre-charged so that the potential difference between BL1 and BL2 becomes the voltage for measurement. In this embodiment, the voltage for measurement is set to, for example, the power supply voltage Vcc (Vcc>0). Since operation when the power supply voltage Vcc is set to a negative value is the same as the operation to be described below, this description is omitted. So the BL1 is pre-charged to Vcc, then BL1, BL2 and BLS are electrically floated. Then the word line WL is activated and the first transistor 14 is turned ON. By this, a part of the electric charges stored in BL1, the capacitor 16 and BLS is transferred to the ferroelectric capacitor 12. The same quantity of electric charges as the transferred electric charges is transferred from the ferroelectric capacitor 12 to BL2. Therefore, the potential $V_{B1}$ of BL1 decreases and the potential $V_{B2}$ of BL2 increases. When the changes of the potential are $\Delta V_{B1}$ (change of potential quantity of BL1) and $\Delta V_{B2}$ (change of potential quantity of BL2), and the change of electric charge quantity (quantity of transferred electric charges) from the capacitor 12 to BL2 is $\Delta Q$, the changes of potential are given by the following formulas (3) and (4) respectively.

$$\Delta V_{B1} = \Delta Q / C_{Bt} \tag{3}$$

where $C_{Bt}$ is the composite capacitance of $C_{B1}$, $C_X$ and $C_{BS}$, and $C_{Bt} = C_{B1} + (1/C_X + 1/C_{BS})^{-1}$ $$\Delta V_{B2} = \Delta Q / C_{B2} \tag{4}$$

Therefore, the potential $V_{B1}$ of BL1 and potential $V_{B2}$ of BL2 when the electric charges are transferred are given by the following formulas (5) and (6).

$$V_{B1} = Vcc - \Delta Q / C_{Bt} \tag{5}$$

$$V_{B2} = \Delta Q / C_{B2} \tag{6}$$

At the same point, the potential $V_{BS}$ of the sub-bit line BLS is given by the following formula (7).

$$V_{BS}=V_{B1}\cdot C_X/(C_X+C_{B1}) \quad (7)$$

Here, the ferroelectric capacitor 12 in FIG. 1 has the hysteresis characteristic shown in FIG. 3. In FIG. 3, the abscissa is the voltage and the ordinate is the electric charge quantity. The ferroelectric capacitor 12 is positioned at point A or point D before the word line WL is activated. The point A and point D correspond to the polarization direction of the ferroelectric capacitor 12. The state of the point A indicates that the ferroelectric capacitor 12 is polarized in the second direction, that is, (←) direction, and the state of point D indicates that the ferroelectric capacitor 12 is polarized in the first direction, that is, (→) direction, which is the opposite of the second direction.

For example, if the word line WL is activated and the first transistor 14 is turned ON when the ferroelectric capacitor 12 is in the point A state, the state of the ferroelectric capacitor 12 changes from the point A to point B. When the ferroelectric capacitor 12 is in the point D state, the state of the ferroelectric capacitor 12 changes from the point D to point C. Therefore, the change of electric charge quantity $\Delta Q$ differs depending on the polarization direction of the ferroelectric capacitor 12. As FIG. 3 shows, the change of electric charge quantity $\Delta Q_1$ when the ferroelectric capacitor 12 is polarized in the second direction ((←)) is higher than the change of electric charge quantity $\Delta Q_0$ when the ferroelectric capacitor 12 is polarized in the first direction ((→)). At reading operation, the voltage for measurement is divided into the voltage to be applied to the ferroelectric capacitor and the voltage to be applied to BL1, so the change of electric charge quantity $\Delta Q$ is determined by the change of the voltage quantity of the ferroelectric capacitor 12 (this differs depending on the polarization direction).

The sense amplifier 18 compares the potential $V_{BS}$ of BLS and the potential $V_{B2}$ of BL2. Therefore, when the change of electric charge quantity $\Delta Q$ is high, data can be read if $V_{B2}$ is higher than $V_{BS}$, and when the change of electric charge quantity $\Delta Q$ is low, data can be read if $V_{B2}$ is lower than $V_{BS}$. As a consequence, the first bit line capacitance $C_{B1}$, the second bit line capacitance $C_{B2}$, the sub-bit line capacitance $C_{BS}$ and the capacitor capacitance $C_X$ are determined so as to satisfy the following formula (8) using the above formulas (5)–(7).

$$Vcc/\Delta Q_1 < 1/C_{B1}+1/C_{B2}+C_{BS}/(C_{B2}\cdot C_X) < Vcc/\Delta Q_0 \quad (8)$$

since $\Delta Q_1 > \Delta Q_0$, $C_{B1}$, $C_{B2}$, $C_{BS}$ and $C_X$ which satisfy the above formula (8) always exist.

In the ferroelectric memory device of the present embodiment, the other electrode 12b of the ferroelectric capacitor 12 and BL2 may be connected via the main current path between the first main electrode 20a and the second main electrode 20b of the second transistor 20, as shown in FIG. 2. In other words, the first main electrode, such as the drain electrode 20a, of the second transistor, is connected to BL2, and the second main electrode, such as the source electrode 20b, is connected to the other electrode 12b of the ferroelectric capacitor 12. In the case of the device shown in FIG. 2, the memory cell 11 comprises the first transistor 14, the second transistor 20 and the ferroelectric capacitor 12. The control electrode (gate) 20c of the second transistor 20 is connected to the word line WL. In the ferroelectric memory device having such a configuration, the capacitance $C_{B2}$ of BL2 can be decreased. Therefore, controllability of BL2 can be improved, and as a result, the operation speed of BL2 can be increased.

Figure 4A:
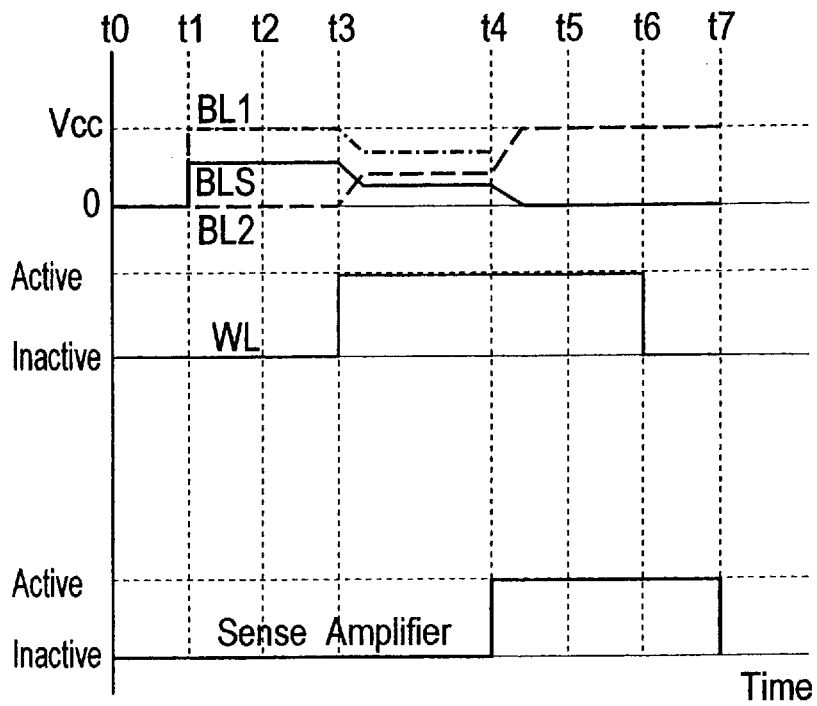
FIG. 4(A) is a timing diagram depicting a reading operation of the first embodiment, where the polarization direction of the ferroelectric capacitor is in the second direction ((←))
Figure 4B:
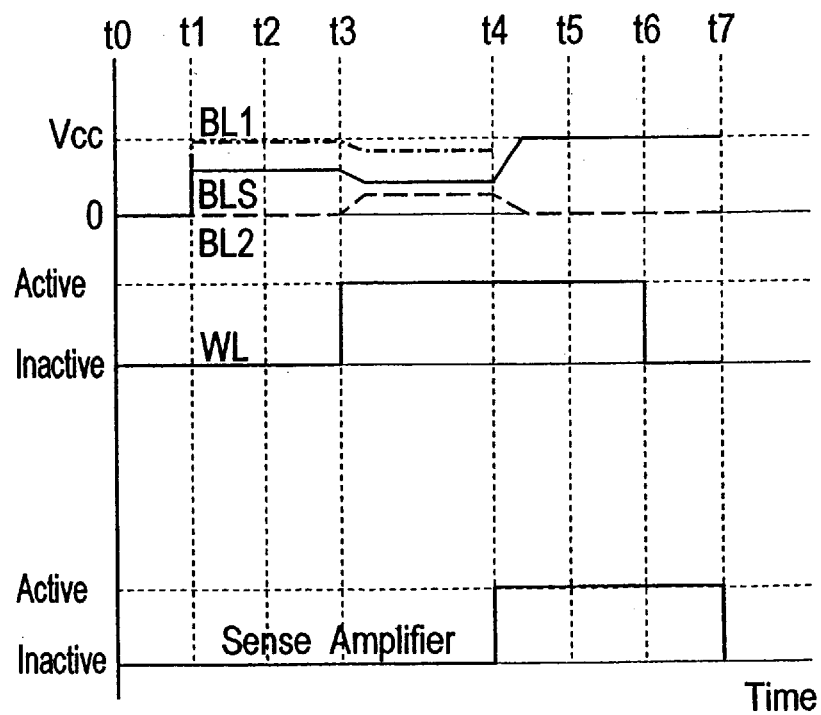
FIG. 4(B) is a timing diagram depicting a reading operation of the first embodiment, where the polarization direction of the ferroelectric capacitor is in the first direction ((→))

Now the reading operation of the ferroelectric memory device shown in FIG. 1 or FIG. 2 of the present embodiment will be described with reference to FIGS. 4(A) and 4(B). FIG. 4(A) and FIG. 4(B) are timing charts depicting the reading operation of the ferroelectric memory device, where the changes of potentials of the first bit line BL1, the second bit line BL2 and the sub-bit line BLS are shown on the time axis respectively. Timings to activate or deactivate WL and timings to activate or deactivate the sense amplifier are also shown on the above time axis. FIG. 4(A) shows the reading operation when the polarization direction of the ferroelectric capacitor 12 is in the second direction ((←)), and FIG. 4(B) shows the reading operation when the polarization direction of the ferroelectric capacitor 12 is in the first direction ((→)).

At first, the reading operation when the ferroelectric capacitor 12 is polarized in the second direction ((←)) will be described with reference to FIG. 4(A).

At time t=0, BL1, BL2 and BLS are set to the same potential. In this case, the ground potential (0V) is used for this same potential.

Then at time t=1, BL1 is pre-charged so that the potential difference between BL1 and BL2 becomes the voltage for measurement. In this embodiment, BL1 is pre-charged to the power supply voltage Vcc.

Then at time t=2, BL1, BL2 and BLS are electrically floated.

Then at time t=3, WL is activated (high level) and the first transistor 14 is turned ON, that is, conducted. By this, a part of the electric charges stored in BL1, the capacitor 16 and BLS is transferred to the ferroelectric capacitor 12. At the same time, electric charges transfer from the ferroelectric capacitor 12 to BL2. At this time, the quantity of the electric charges transferred from the BL1, the capacitor 16 and BLS to the ferroelectric capacitor 12 and the quantity of the electric charges transferred from the ferroelectric capacitor 12 to BL2 are the same. By this transfer of the electric charges, the potential $V_{B1}$ of BL1 and the potential $V_{BS}$ of BLS decrease, and the potential $V_{B2}$ of BL2 increases. Here, the ferroelectric capacitor 12 is polarized in the second direction ((←)), so the change of the electric charge quantity is high, and the ferroelectric capacitor 12 accompanies polarization inversion. $V_{B2}$ becomes higher than $V_{BS}$.

In the case of the device in FIG. 2, if WL is activated at time t=3, the first transistor 14 and the second transistor 20 turn ON and the same operation as above is executed.

Then at time t=4, the sense amplifier 18 is activated to compare the potentials of BL2 and BLS. $V_{B2}$ is amplified by the sense amplifier 18 and is detected as the potential Vcc (that is, the power supply potential). $V_{BS}$, on the other hand, is detected as the ground potential (0V). Reading accompanying polarization inversion of the ferroelectric capacitor 12 in this way is called "1 reading".

Then at time t=5, output from the sense amplifier 18 is returned to BL2. The sense amplifier 18 is a latch type amplifier. Since the potential $V_{B2}$ of BL2 has been increased up to Vcc, the voltage Vcc is applied to both electrodes of the ferroelectric capacitor 12 such that the electrode 12b at the BL2 side becomes high potential, and the electrode 12a at the BL1 side becomes low potential. By this, the ferroelectric capacitor 12, which polarization was inverted by reading, can be returned to the polarization state at writing (polarized in the second direction (←)). As a consequence, data can be restored.

Then at time t=6, WL is deactivated (low level), and the first transistor 14 is turned OFF, then at time t=7, the sense amplifier 18 is deactivated. Now the reading operation completes.

The reading operation when the ferroelectric capacitor 12 is polarized in the first direction ((→)) will now be described with reference to FIG. 4(B).

At time t=0, BL1, BL2 and BLS are set to the ground potential.

Then at time t=1, BL1 is pre-charged to Vcc (power supply potential).

Then at time t=2, BL1, BL2 and BLS are floated.

Then at time t=3, WL is activated and the first transistor 14 is conducted. By this, the electric charges stored in BL1, the capacitor 16 and BLS transfer to the ferroelectric capacitor 12, and at the same time, electric charges transfer from the ferroelectric capacitor 12 to BL2. By this transfer of electric charges, the potential $V_{B1}$ of BL1 and the potential $V_{BS}$ of BLS decrease, and the potential $V_{B2}$ of BL2 increases. The quantity of electric charges which transfer here (change of electric charge quantity) differs depending on the polarization direction of the ferroelectric capacitor 12. Since the ferroelectric capacitor 12 is polarized in the first direction ((→)) here, the change of the electric charge quantity is lower than the case when the ferroelectric capacitor 12 is polarized in the second direction ((←)) . When the change of the electric charge quantity is low, the change of the potential quantity is also low, so the polarization of the ferroelectric capacitor 12 is not inverted. And $V_{B2}$ remains lower than $V_{BS}$.

Then at time t=4, the sense amplifier 18 is activated to compare the potentials of BL2 and BLS, then $V_{B2}$ is detected as the ground potential (0V), and $V_{BS}$ is detected as the potential Vcc. Reading not accompanying the polarization inversion of the ferroelectric capacitor 12 in this way is called "0 reading".

Then at time t=5, output from the sense amplifier 18 is returned to BL2. Since the potential $V_{B2}$ of BL2 is 0V, voltage is applied to both electrodes of the ferroelectric capacitor 12 such that the electrode at the BL2 side becomes low potential, and the electrode at the BL1 side becomes high potential. By this, voltage in the same direction as the polarization direction of the ferroelectric capacitor 12, that is, in the first direction ((→)), is applied to the ferroelectric capacitor 12. At this time, applying this voltage does not change the polarization direction. So the ferroelectric capacitor 12 can be maintained in the state at data writing.

Then at time t=6, WL is deactivated (low level), and the first transistor 14 is turned OFF. This makes the ferroelectric capacitor 12 nonconductive.

Then at time t=7, the sense amplifier 18 is deactivated so as to complete the reading operation.

Therefore, in the ferroelectric memory device of this embodiment, the polarization direction of the ferroelectric capacitor 12 can be judged by comparing the potential $V_{BS}$ of BLS and the potential $V_{B2}$ of BL2 using the sense amplifier 18 when the data is read. In other words, information written in the ferroelectric capacitor 12 can be read. Specifically, when the potential $V_{B2}$ is higher than $V_{BS}$, the polarization direction of the ferroelectric capacitor 12 is the second direction ((←)), and when the potential $V_{B2}$ is lower than $V_{BS}$, the polarization direction of the ferroelectric capacitor 12 is the first direction ((→)).

When the polarization direction of the ferroelectric capacitor 12 is in the second direction ((←)), the reading operation accompanies polarization inversion, so after reading the data, the ferroelectric capacitor 12 is polarized in the first direction ((→)), which is different from the direction at writing. By returning the output from the sense amplifier 18 back to BL2, the polarization direction of the ferroelectric capacitor 12 can be restored to the same direction as that at writing, that is, the second direction ((←)).

Second Embodiment

Figure 5:
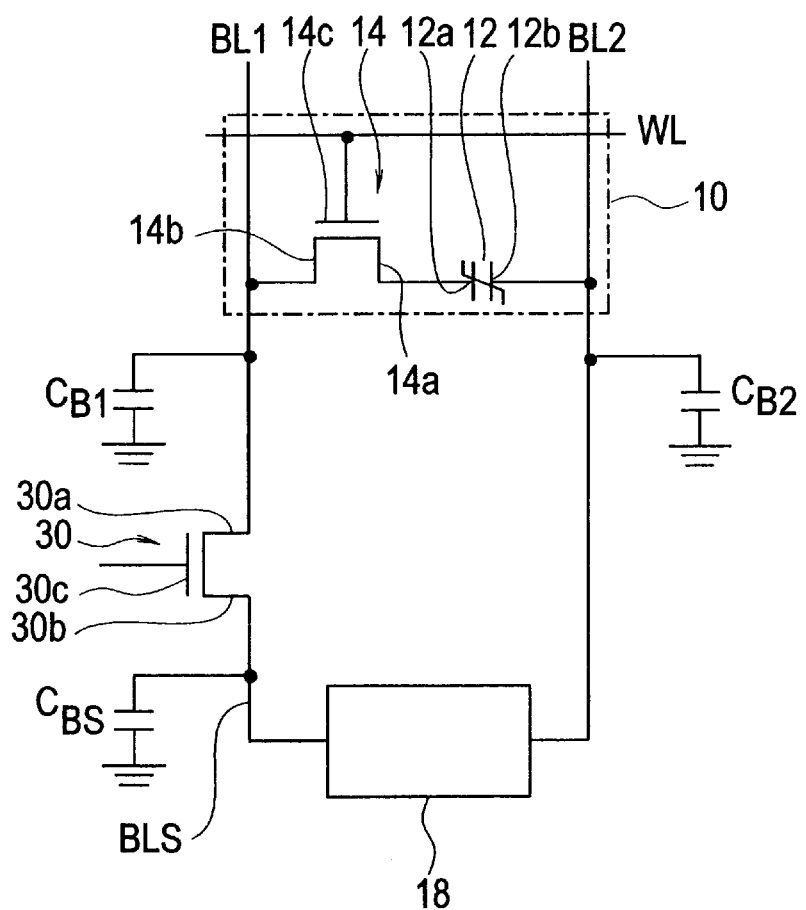
FIG. 5 is a circuit diagram depicting a configuration of a ferroelectric memory device to be used for description of the second embodiment.
Figure 6:
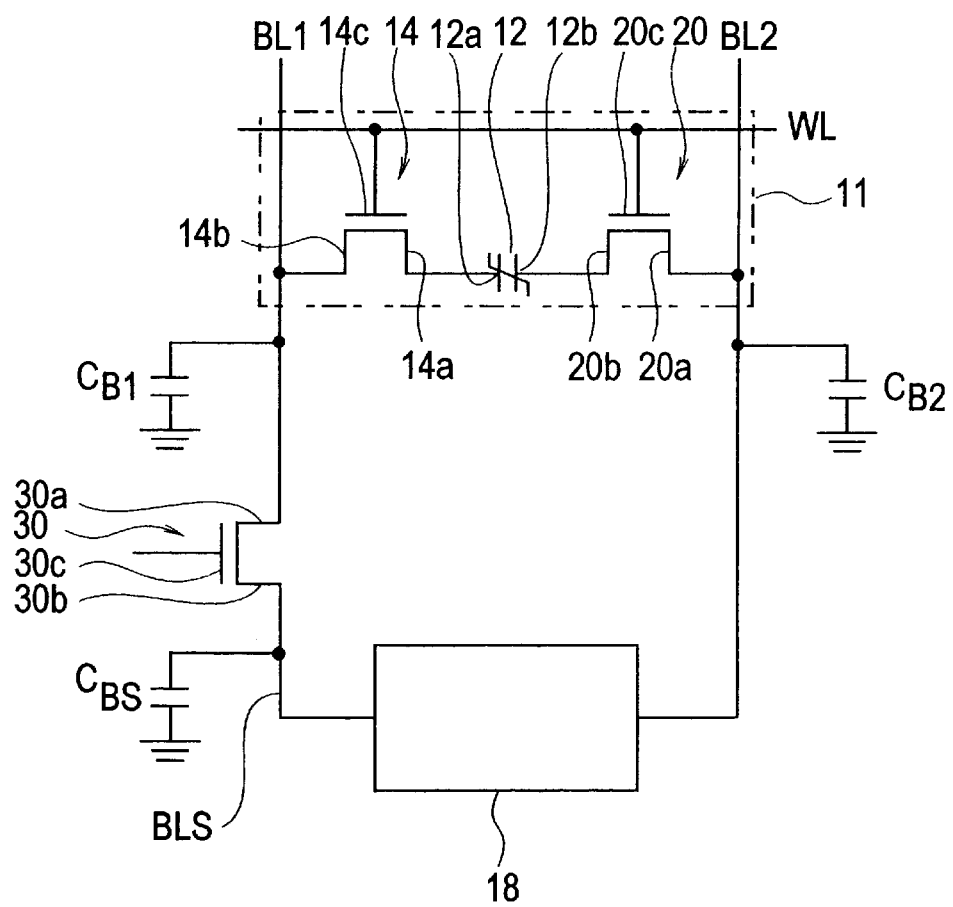
FIG. 6 is a circuit diagram depicting a configuration of a ferroelectric memory device to be used for description of the second embodiment.

The structure and data reading method of the ferroelectric memory device in accordance with the second embodiment will now be described with reference to FIG. 5 to FIG. 7. FIG. 5 and FIG. 6 are circuit diagrams depicting a configuration of the ferroelectric memory device of the present embodiment.

In the following description, only the differences from the first embodiment will be described, and a detailed description on the common points with the first embodiment will be omitted.

According to FIG. 5, one memory cell 10 is comprised of one ferroelectric capacitor 12 and a first transistor 14. One end of the main current path of the first transistor 14, that is, a first main electrode, such as a drain electrode 14a, is connected to one electrode 12a of the ferroelectric capacitor 12. The ferroelectric memory device comprises at least one memory cell 10 mentioned above, a word line WL, a first bit line BL1, a second bit line BL2, a switch transistor 30, a sub-bit line BLS, and a sense amplifier 18. The above mentioned word line WL is connected to a gate 14c, which is a control electrode of the first transistor 14. The above mentioned first bit line BL1 is connected to the other end of the main current path of the first transistor 14, that is, the second main electrode, such as a source electrode 14b. The above mentioned second bit line BL2 is connected to the other electrode 12b of the ferroelectric capacitor 12. The above mentioned switch transistor 30 is connected to BL1. The above mentioned sub-bit line BLS is connected to the side which is not connected to BL1 of the switch transistor 30. The above mentioned sense amplifier 18 is for detecting which one of the potentials of BLS and BL2 is higher or lower. In this example, the first main electrode, such as the drain electrode 30a, of the switch transistor 30 is connected to the first bit line BL1, and the second main electrode, such as the source electrode 30b, is connected to the sub-bit line BLS.

The capacitance $C_{B1}$ of BL1, the capacitance $C_{B2}$ of BL2 and the capacitance $C_{BS}$ of BLS are determined as follows.

Just like the first embodiment, the potentials of BL1, BL2 and BLS are set to the ground potential. Then BL1 is pre-charged to the power supply potential Vcc (Vcc>0). Since the operation is the same when the power supply voltage Vcc is set to a negative value, the description for Vcc<0 is omitted here. BL1 and BL2 are electrically floated. Then WL is activated and the first transistor 14 is turned ON. By this, a part of the electric charges stored in BL1 transfers to the ferroelectric capacitor 12. At the same time, the same quantity of the electric charges as the transferred electric charges transfer from the ferroelectric capacitor 12 to BL2. By this transfer of electric charges, the potential $V_{B1}$ of BL1 decreases and the potential $V_{B2}$ of BL2 increases. If the changes of the potentials of BL1 and BL2 are $\Delta V_{B1}$ and $\Delta V_{B2}$ respectively, and the change of electric charge quantity is $\Delta q$, the changes of the potentials are given by the following formulas (9) and (10) respectively.

$$\Delta V_{B1} = \Delta q / C_{B1} \tag{9}$$

$$\Delta V_{B2} = \Delta q / C_{B2} \tag{10}$$

Therefore, $V_{B1}$ and $V_{B2}$ when the electric charges are transferred are given by the following formulas (11) and (12) respectively.

$$V_{B1} Vcc - \Delta q / C_{B1} \tag{11}$$

$$V_{B2} \Delta q / C_{B2} \tag{12}$$

Here, the ferroelectric capacitor 12 has the same characteristics as that of the first embodiment. Therefore, the change of the electric charge quantity Δq, which transfers when the first transistor 14 is turned ON, differs depending on the polarization direction of the ferroelectric capacitor 12. In this case, Δq is higher than the case when the ferroelectric capacitor 12 is polarized in the second direction ((←)) than when polarized in the first direction ((→)), which is the opposite direction of the second direction. According to this embodiment, after turning OFF the first transistor 14, voltage is applied to the gate 30c, which is the control electrode of the switch transistor 30, so as to turn this transistor 30 ON. By this, a part of the electric charges remaining in BL1 transfer to BLS. Therefore, the potential $V_{B1}$ of BL1 further decreases. And the potential $V_{B1}$ of BL1 and the potential $V_{BS}$ Of BLS become equal. $V_{B1}$ is given by the following formula (13).

$$V_{B1}=V_{BS}=(Vcc-\Delta q/C_{B1})/K \quad (13)$$

where $K=1+C_{BS}/C_{B1}$.

The first transistor 14 is OFF at this time, so no electric charges transfer in the potential $V_{B2}$ of BL2.

The sense amplifier 18 is connected between the second bit line BL2 and the sub-bit line BLS, and compares $V_{BS}$ and $V_{B2}$. Since the potentials of $V_{BS}$ and $V_{B1}$ are the same, the sense amplifier 18 actually compares $V_{B1}$ and $V_{B2}$. To read data here, it is necessary to set $V_{B2}$ higher than $V_{BS}$ when Δq is high, and to set $V_{B2}$ lower than $V_{BS}$ when Δq is low. So, if Δq, when the polarization direction of the ferroelectric capacitor 12 is the second direction ((←)), is $\Delta q_1$, and Δq, when the polarization direction is the first direction ((→)), is $\Delta q_0$, $C_{B1}$, $C_{B2}$ and $C_{BS}$ are determined so as to satisfy the following formula (14) by the above formulas (12) and (13).

$$Vcc/\Delta q_1 < (K/C_{B2}+1/C_{B1}) < Vcc/\Delta q_0 \quad (14)$$

Since $\Delta q_1 > \Delta q_0$, $C_{B1}$, $C_{B2}$ and $C_{BS}$, which satisfy the above formula (14), always exist.

In the ferroelectric memory device of the present embodiment, the other electrode 12b of the ferroelectric capacitor 12 and BL2 may be connected via the main current path of the second transistor 20, as shown in FIG. 6, just like the case of FIG. 2. In this case, the memory cell 11 of this device is comprised of the first transistor 14, the second transistor 20 and the ferroelectric capacitor 12. The control electrode (gate) 20c of the second transistor 20 is connected to WL. By this, the capacitance $C_{B2}$ of BL2 can be decreased. As a consequence, controllability of BL2 can be improved, and as a result the operation speed of BL2 can be increased.

Figure 7A:
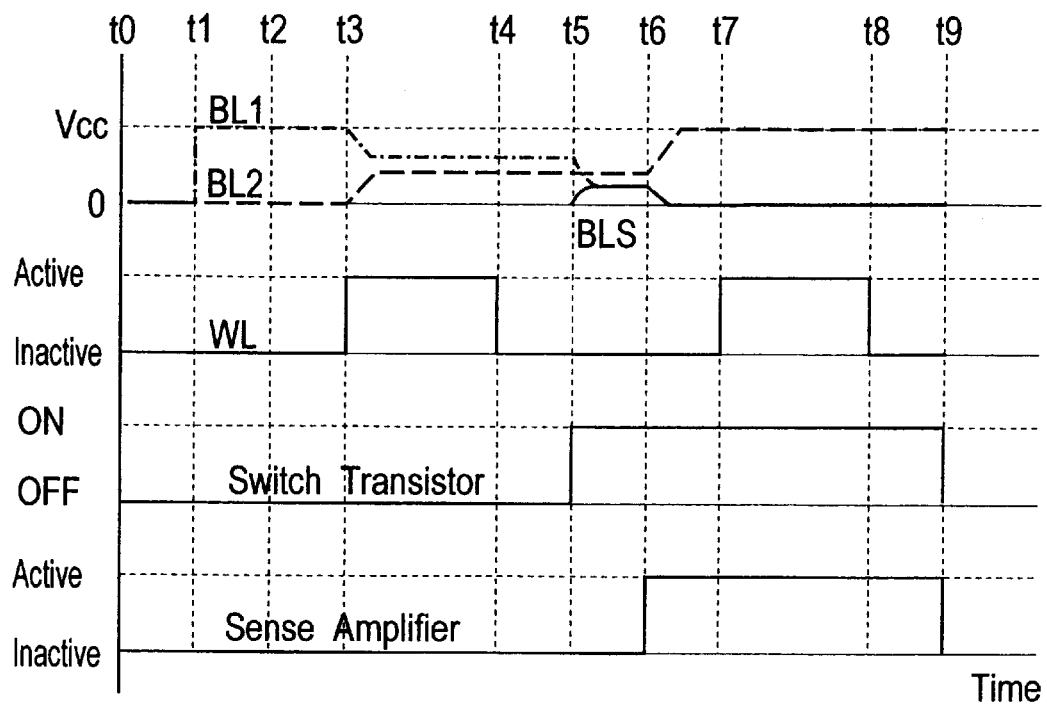
FIG. 7(A) is a timing diagram depicting the reading operation of the second embodiment, where the polarization direction of the ferroelectric capacitor is in the second direction ((←))
Figure 7B:
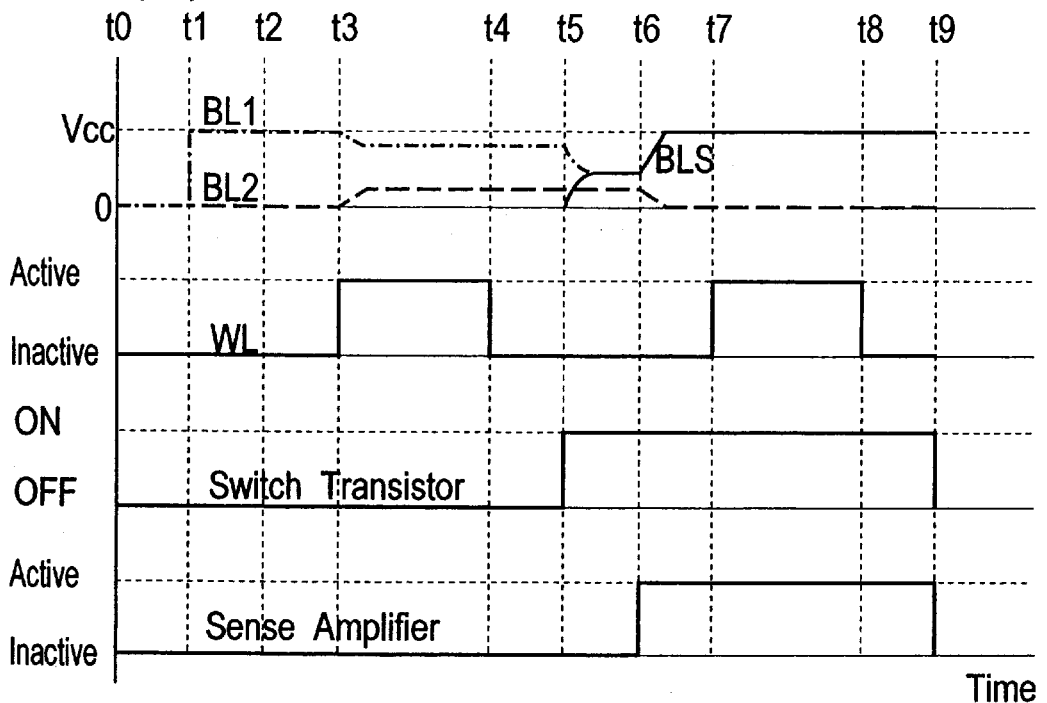
FIG. 7(B) is a timing diagram depicting the reading operation of the second embodiment, where the polarization direction of the ferroelectric capacitor is in the first direction ((→))

Now the reading operation of the ferroelectric memory device shown in FIG. 5 or FIG. 6 of the present embodiment will be described with reference to FIG. 7(A) and FIG. 7(B). FIG. 7(A) and FIG. 7(B) are timing charts depicting the reading operation of this ferroelectric memory device, where the respective changes of the potentials of BL1, BL2 and BLS are shown on the time axis. Timings to activate or deactivate WL, timings to turn the switch transistor 30 ON or OFF, and timings to activate or deactivate the sense amplifier 18 are also shown on the above time axis. FIG. 7(A) shows the reading operation when the polarization direction of the ferroelectric capacitor 12 is in the second direction ((←)), and FIG. 7(B) shows the reading operation when the polarization direction of the ferroelectric capacitor 12 is in the first direction ((→)).

At first, the data reading operation, when the ferroelectric capacitor 12 is polarized in the second direction ((←)), will be described with reference to FIG. 7(A).

At time t=0, BL1, BL2 and BLS are set to the same potential. In this case, the ground potential (0V) is used. The switch transistor 30 is OFF.

Then at t=1, BL1 is pre-charged so that the potential difference between BL1 and BL2 becomes the voltage for measurement. In this case, BL1 is pre-charged to the power supply voltage Vcc.

Then at t=2, BL1 and BL2 are electrically floated.

Then at t=3, the word line WL is activated. In this case, WL is set to high level, and the first transistor 14 is turned ON, that is, conducted. By this, a part of the electric charges stored in BL1 transfers to the ferroelectric capacitor 12. At the same time, electric charges transfer from the ferroelectric capacitor 12 to BL2. And at this time, the quantity of the electric charges transferred from BL1 to the ferroelectric capacitor 12 and the quantity of the electric charges transferred from the ferroelectric capacitor 12 to BL2 are the same. By this transfer of electric charges, the potential $V_{B1}$ of BL1 decreases, and the potential $V_{B2}$ of BL2 increases. Here, the ferroelectric capacitor 12 is polarized in the second direction ((←)), so the change of the electric charge quantity is high, and the polarization of the ferroelectric capacitor 12 is inverted. At this point, the potential difference between $V_{B1}$ and $V_{B2}$ decreases, but $V_{B1}$ is still higher than $V_{B2}$.

In the case of the device in FIG. 6, if the word line WL is activated at time t=3, the first transistor 14 and the second transistor 20 turn ON, and the same operation as above is executed.

Then at time t=4, WL is deactivated (low level), and the first transistor 14 (the first transistor 14 and the second transistor 20 in the case of the device in FIG. 6) is turned OFF.

Then at time t=5, the switch transistor 30 is turned ON. By this, BL1 and BLS are conducted, and a part of the electric charges remaining in BL1 transfer to BLS. By this, the potential $V_{B1}$ of BL1 further decreases. And the potential $V_{BS}$ of BLS increases to the same level as $V_{B1}$. At this time, the electric charges in BL2 do not transfer, since the first transistor 14 (the first and second transistors 14 and 20 in the case of the device in FIG. 6) is OFF. By this, $V_{B1}$ becomes lower than $V_{B2}$. Since the potentials of $V_{BS}$ and $V_{B1}$ are equal, $V_{BS}$ is also lower than $V_{B2}$.

Then at time t=6, the sense amplifier 18 is activated to compare the potentials of BL2 and BLS. $V_{B2}$ is amplified by the sense amplifier 18 and detected as the potential Vcc. $V_{BS}$, on the other hand, is detected as the ground potential (0V). In this way, "1 reading" is executed.

Then at time t=7, WL is activated (high level) again, and the first transistor 14 (first and second transistors 14 and 20 in the case of the device in FIG. 6) is turned ON. By this, output of the sense amplifier 18 can be returned to BL2. Therefore, the voltage Vcc is applied to both electrodes 12a and 12b of the ferroelectric capacitor 12 such that the electrode 12b at the BL2 side becomes high potential and the electrode 12a at the BL1 side becomes low potential. By this, the ferroelectric capacitor 12, which polarization is inverted to the first direction ((→)) by reading, can be returned to the polarization state at writing (polarized in the second direction (←)). As a result, data can be restored.

Then at time t=8, WL is deactivated, and at time t=9, the switch transistor 30 is turned OFF and the sense amplifier 18 is deactivated. By this, a series of read operations is completed.

The reading operation when the ferroelectric capacitor 12 is polarized in the first direction ((→)) will now be described with reference to FIG. 7(B).

At time t=0, BL1, BL2 and BLS are set to the ground potential.

Then at time t=1, BL1 is pre-charged to Vcc.

Then at time t=2, BL1 and BL2 are electrically floated.

Then at time t=3, WL is activated and the first transistor 14 (first and second transistors 14 and 20 in the case of the device in FIG. 6) is conducted. By this, the electric charges stored in BL1 transfer to the ferroelectric capacitor 12, and at the same time, the electric charges transfer from the ferroelectric capacitor 12 to BL2. By this transfer of electric charges, the potential $V_{B1}$ of BL1 decreases and the potential $V_{B2}$ of BL2 increases. The quantity of the electric charges transferred here (change of electric charge quantity) differs depending on the polarization direction of the ferroelectric capacitor 12. Since the ferroelectric capacitor 12 is polarized in the first direction (($\rightarrow$)) here, the change of electric charge quantity is lower than the case when the ferroelectric capacitor 12 is polarized in the second direction (($\leftarrow$)). When the change of the electric charge quantity is low, the change of the potential quantity is also low, so the polarization of the ferroelectric capacitor 12 is not inverted. And $V_{B2}$ is lower than $V_{BS}$.

Then at time t=4, WL is deactivated. This turns the first transistor 14 (first and second transistors 14 and 20 in the case of the device in FIG. 6) OFF.

Then at t=5, voltage is applied to the gate 30c of the switch transistor 30 so as to turn this transistor 30 ON. By this, a part of the electric charges transfer from BL1 to BLS. Therefore, the potential $V_{B1}$ of BL1 further decreases and the potential $V_{BS}$ of BLS increases. And the potentials of $V_{B1}$ and $V_{BS}$ become equal. Transfer of electric charges does not occur in BL2, since the first transistor 14 (first and second transistors 14 and 20 in the case of the device in FIG. 6) is not conducted. At this point, the potential $V_{B1}$ of BL1 is decreased, but is still higher than the potential $V_{B2}$ of BL2.

Then at t=6, the sense amplifier 18 is activated to compare the potentials of BL2 and BLS, then $V_{B2}$ is detected as the ground potential (0V), and $V_{BS}$ is detected as Vcc. By this, "0 reading" is executed.

Then at t=7, WL is set to high level again and the output from the sense amplifier 18 is returned to BL2. Since the potential $V_{B2}$ of BL2 to be output is 0V, voltage is applied to both electrodes of the ferroelectric capacitor 12 such that the electrode 12a at the BL2 side becomes low potential, and the electrode 12b at the BL1 side becomes high potential. Since voltage in the first direction (($\rightarrow$)), that is, the same direction as the polarization direction of the ferroelectric capacitor 12, is applied, applying this voltage does not change the polarization direction. So the ferroelectric capacitor 12 can be maintained in the state at data writing.

Then at time t=8, WL is set to low level, and the first transistor 14 (first and second transistors 14 and 20 in the case of the device in FIG. 6) is turned OFF. Then at t=9, the switch transistor 30 is turned OFF and the sense amplifier 18 is deactivated, so as to complete the read operation.

Therefore, in the ferroelectric memory device of this embodiment, the polarization direction of the ferroelectric capacitor 12 can be judged by comparing the potential $V_{BS}$ of BLS and the potential $V_{B2}$ of BL2 using the sense amplifier 18. In other words, information written in the ferroelectric capacitor 12 can be read. Specifically, when the potential $V_{B2}$ is higher than $V_{BS}$, the polarization direction of the ferroelectric capacitor 12 is the second direction (($\leftarrow$)), and when the potential $V_{B2}$ is lower than $V_{BS}$, the polarization direction of the ferroelectric capacitor 12 is the first direction (($\rightarrow$)).

When the polarization direction of the ferroelectric capacitor 12 is in the second direction (($\leftarrow$)), the reading operation accompanies the polarization inversion, so after reading data, the ferroelectric capacitor 12 is polarized in the first direction (($\rightarrow$)), which is different from the direction at writing. By returning the output from the sense amplifier 18 back to BL2, the polarization direction of the ferroelectric capacitor 12 can be restored to the second direction (($\leftarrow$)) which is the same as that at writing.

Next some configuration examples of the ferroelectric memory device of the present invention will be described. Note, however, that the materials to be used and numerical conditions, such as the size of components, film thickness and power supply voltage, are merely examples used in the scope of the present invention.

First Configuration Example

As a first configuration example, one setting example of each capacitance (first bit line, second bit line, sub-bit line and capacitor) for reading data from the ferroelectric memory device having the structure shown in FIG. 1 will be described with reference to FIG. 8.

Figure 8:
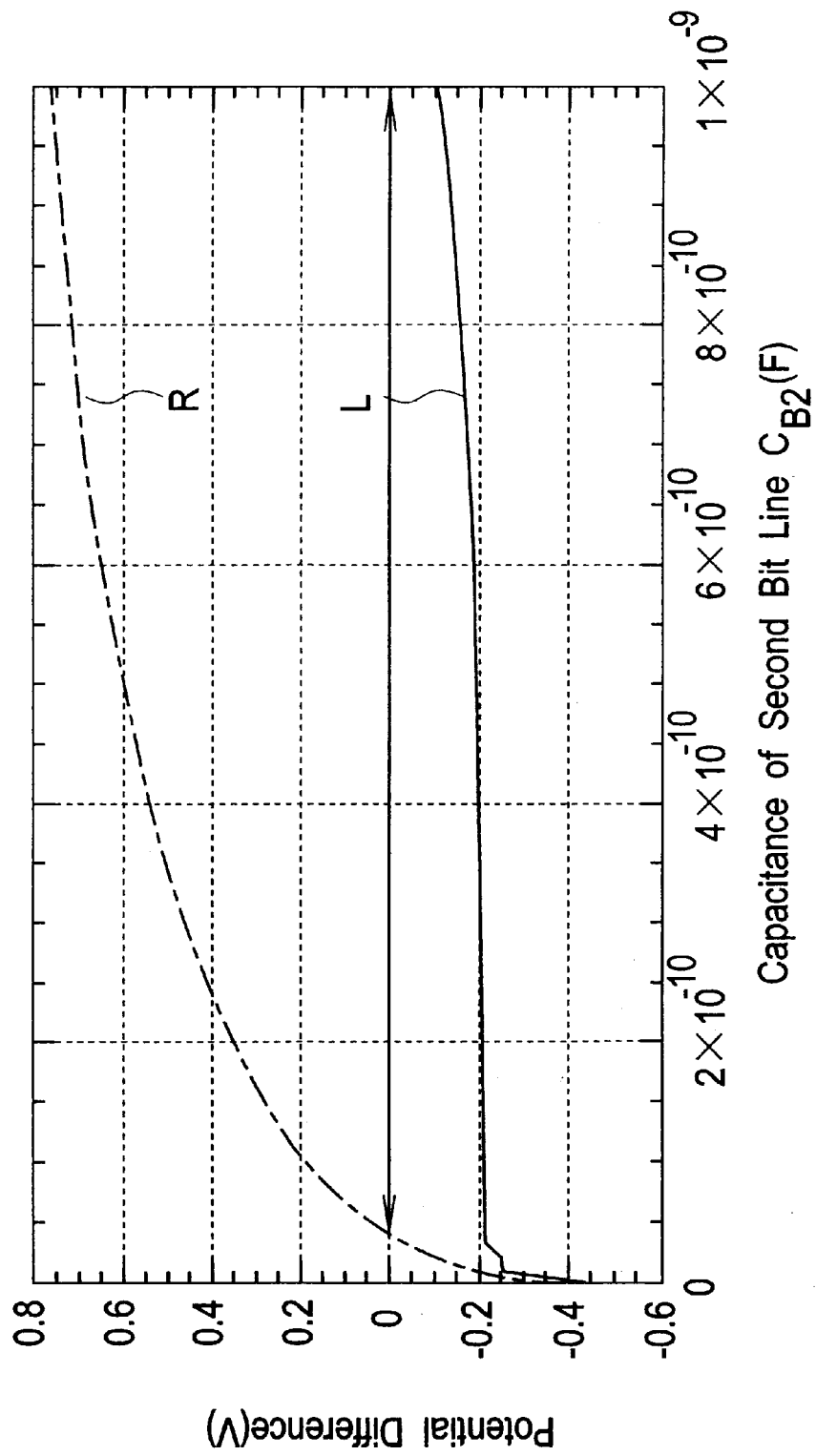
FIG. 8 is a characteristic diagram based on a simulation result depicting the dependency of the potential difference on capacitance to be used for description of the first configuration example.

FIG. 8 is a characteristic diagram depicting the capacitance dependency of the potential detected by the sense amplifier. In FIG. 8, the abscissa is the capacitance $C_{B2}$ (F) of the second bit line, and the ordinate is the potential difference (V) between the potential $V_{BS}$ of the sub-bit line BLS and the potential $V_{B2}$ of the second bit line BL2.

In this configuration example, the ferroelectric film of the ferroelectric capacitor 12 is $SrBi_2Ta_2O_9$ film and the film thickness is 0.2 $\mu$m. The plate area of the capacitor 16 is $2.5 \times 10^{-5}$ cm$^2$. The power supply voltage is Vcc=3V. In this example, the capacitance $C_{B1}$ of the first bit line BL1, the capacitance $C_{B2}$ of the second bit line BL2, the capacitance $C_{BS}$ of the sub-bit line BLS and the capacitance $C_X$ of the capacitor 16 are set as follows.

$$C_X = C_{B2}/20$$

$$C_{B1} = C_{BS} = C_{B2}/10$$

After each capacitance is set in this way, the potential difference between $V_{BS}$ and $V_{B2}$ is simulated while changing $C_{B2}$ from 0 F to $1 \times 10^{-9}$ F so as to check the range of $C_{B2}$, where the reading operation of the above ferroelectric memory device can be executed. This simulation is executed assuming both cases when the ferroelectric capacitor 12 is polarized in the second direction (($\leftarrow$)) and when polarized in the first direction (($\rightarrow$)).

FIG. 8 shows the result of the simulation. The curve L is the potential difference ($V_{BS}-V_{B2}$) between $V_{BS}$ and $V_{B2}$ when the ferroelectric capacitor 12 is polarized in the second direction, and the curve R is the potential difference ($V_{BS}-V_{B2}$) between $V_{BS}$ and $V_{B2}$ when the ferroelectric capacitor 12 is polarized in the first direction.

When the ferroelectric capacitor 12 is polarized in the second direction, $V_{B2}$, to be detected, is higher than $V_{BS}$. Therefore, $V_{BS}-V_{B2}$ is a negative value. When the ferroelectric capacitor 12 is polarized in the first direction, $V_{BS}$, to be detected, is higher than $V_{B2}$. Therefore, $V_{BS}-V_{B2}$ is a positive value. According to the curve L in FIG. 8, the potential difference becomes a negative value when $C_{B2}$ is 0 F or more. According to the curve R, the potential difference becomes a positive value when $C_{B2}$ is approximately $5 \times 10^{-11}$ F or more. Therefore, when each capacitance is set as above, data can be accurately read from the ferroelectric memory device with the structure shown in FIG. 1, if $C_{B2}$ is the capacitance of $5 \times 10^{-11}$ F or more, and $1 \times 10^{-9}$ F or less. This is true for $C_{B2}$, which is $1 \times 10^{-9}$ F or more.

The settings of each capacitance are not limited to the settings used for this example. In this example, $C_{B2}$ is defined as the reference capacitance and the applicable range of this capacitance was examined, but another capacitance may be defined as the reference capacitance.

Second Configuration Example

As a second configuration example, one setting example of each capacitance for reading data from the ferroelectric memory device having the structure shown in FIG. 2 will be described with reference to FIG. 9.

Figure 9:
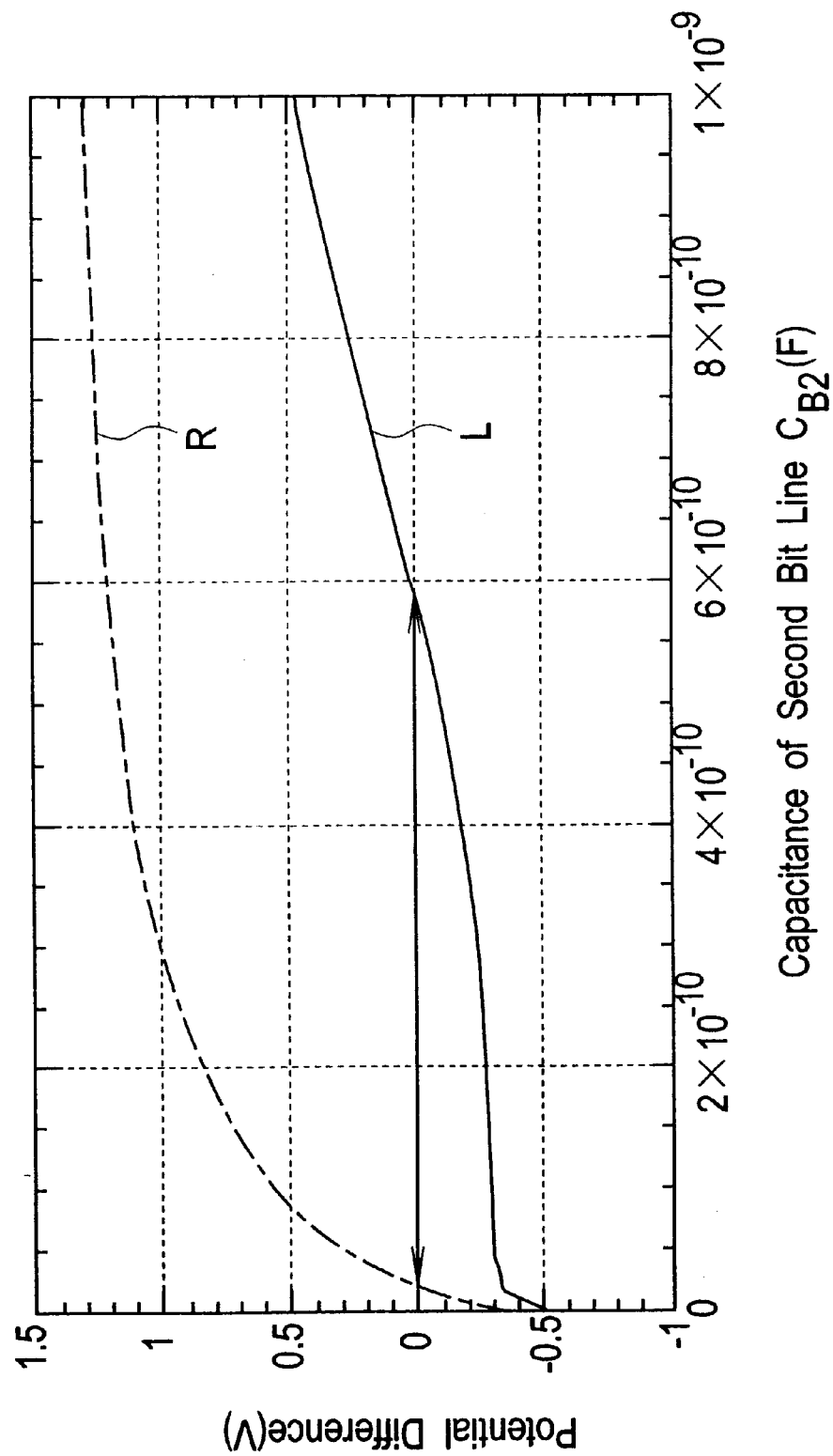
FIG. 9 is a characteristic diagram based on a simulation result depicting the dependency of the potential difference on capacitance to be used for description of the second configuration example.

FIG. 9 is a characteristic diagram depicting the capacitance dependency of the potential detected by the sense amplifier. In FIG. 9, the abscissa is the capacitance $C_{B2}$ (F) of the second bit line, and the ordinate is the potential difference (V) between the potential $V_{BS}$ of the sub-bit line BLS and the potential $V_{B2}$ of the second bit line BL2.

In this configuration example, just like the first configuration example, the ferroelectric film of the ferroelectric capacitor 12 is $SrBi_2Ta_2O_9$ film, and the film thickness is 0.2 μm. The plate area of the capacitor 16 is $2.5 \times 10^{-5}$ $cm^2$. The power supply voltage is Vcc=3V.

And in this example, the capacitance $C_{B1}$ of the first bit line BL1, the capacitance $C_{B2}$ of the second bit line BL2, the capacitance $C_{BS}$ of the sub-bit line BLS, and the capacitance $C_X$ of the capacitor 16 are set as follows.

$$C_{B1}=C_{B2}/10$$

$$C_{BS}=C_X=C_{B2}/2$$

After each capacitance is set in this way, the potential difference between $V_{BS}$ and $V_{B2}$ is simulated while changing $C_{B2}$ from 0 F to $1 \times 10^{-9}$ F, in the same way as the first configuration example so as to check the range of $C_{B2}$, where the reading operation of the above ferroelectric memory device can be executed.

FIG. 9 shows the result of the simulation. The curve L is the potential difference ($V_{BS}-V_{B2}$) between $V_{BS}$ and $V_{B2}$ when the ferroelectric capacitor 12 is polarized in the second direction, and the curve R is the potential difference ($V_{BS}-V_{B2}$) between $V_{BS}$ and $V_{B2}$ when the ferroelectric capacitor 12 is polarized in the first direction.

According to the curve L in FIG. 9, the potential difference becomes a negative value when $C_{B2}$ is approximately in the approximate $0-6 \times 10^{-10}$ F range. In the curve R, the potential difference becomes a positive value when $C_{B2}$ is approximately in the $3 \times 10^{-11}$ F range or more. Therefore, if the capacitance of $C_{B2}$ is in the $3 \times 10^{-11} - 6 \times 10^{-10}$ F range when each capacitance is set as above, then data can be accurately read from the ferroelectric memory device having the structure shown in FIG. 2.

The settings of each capacitance are not limited to the settings used for this example. In this example, $C_{B2}$ is defined as the reference capacitance and the applicable range of this capacitance was examined, but another capacitance may be defined as the reference capacitance.

Third Configuration Example

As a third configuration example, one setting example of each capacitance (first bit line, second bit line and sub-bit line) for reading data from the ferroelectric memory device having the structure shown in FIG. 5 will be described with reference to FIG. 10.

Figure 10:
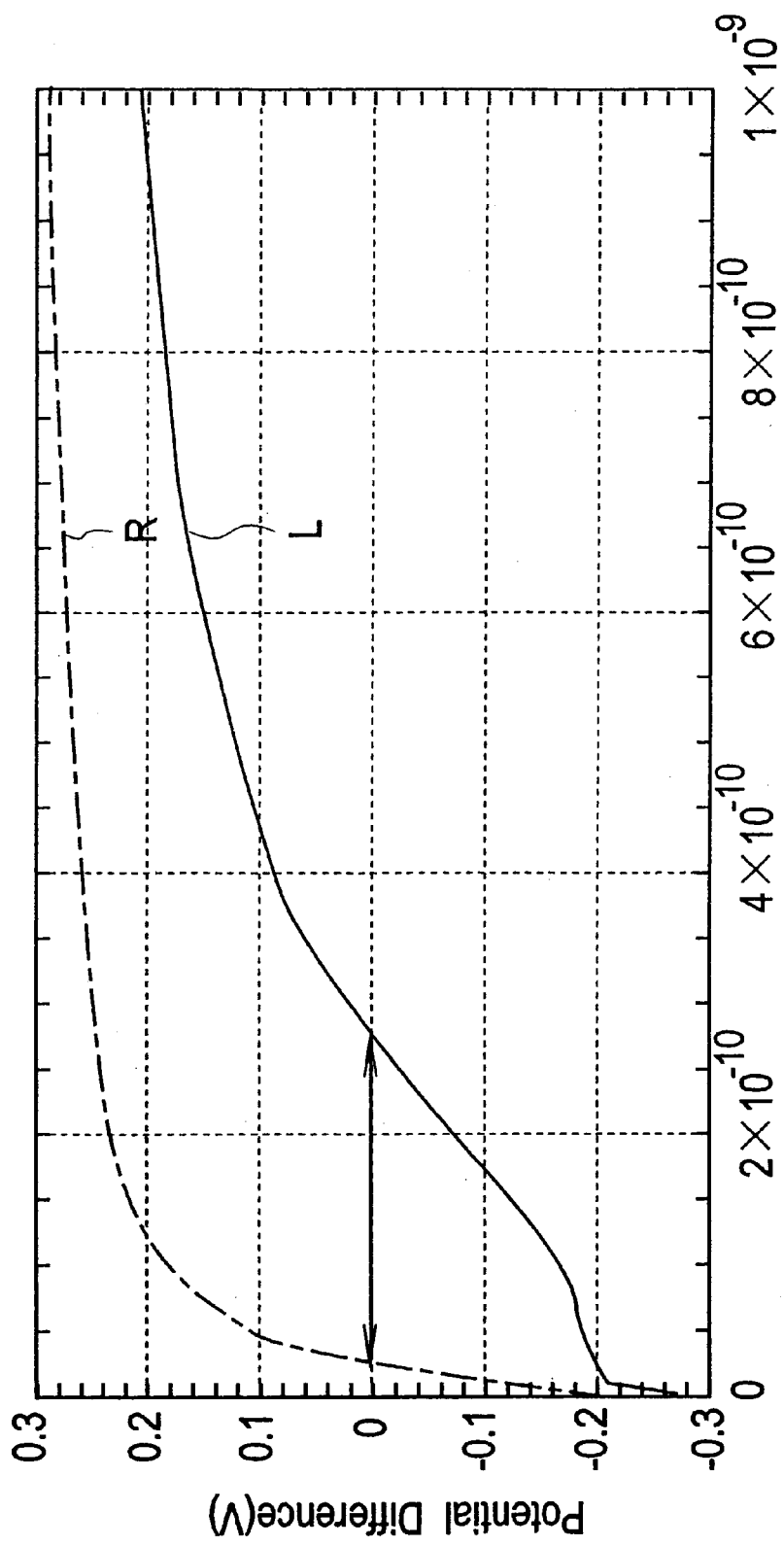
FIG. 10 is a characteristic diagram based on a simulation result depicting the dependency of the potential difference on capacitance to be used for description of the third configuration example.

FIG. 10 is a characteristic diagram depicting the capacitance dependency of the potential detected by the sense amplifier. In FIG. 10, the abscissa is the capacitance $C_{B1}$ (F) of the first bit line, and the ordinate is the potential difference (V) between the potential $V_{B1}$ of the first bit line BL1 and the potential $V_{B2}$ of the second bit line BL2. The potential which is actually output from the sense amplifier 18 is the potential $V_{B2}$ Of the second bit line and the potential $V_{BS}$ of the sub-bit line, but in this example, the ordinate is the potential difference between $V_{B1}$ and $V_{B2}$, since the potential $V_{BS}$ to be output and $V_{B1}$ of the first bit line are equal.

In this configuration example, just like the first configuration example, the ferroelectric film of the ferroelectric capacitor 12 is $SrBi_2Ta_2O_9$ film, and the film thickness is 0.2 μm. The power supply voltage is Vcc=3V.

And in this example, the capacitance $C_{B1}$ of the first bit line BL1, the capacitance $C_{B2}$ of the second bit line BL2, and the capacitance $C_{BS}$ of the sub-bit line BLS are set as follows.

$$C_{BS}=C_{B1} \times 9$$

$$C_{B2}=C_{B1} \times 10$$

After each capacitance is set in this way, the potential difference between $V_{B1}$ and $V_{B2}$ is simulated while changing $C_{B1}$ from 0 F to $1 \times 10^{-9}$ F, so as to check the range of $C_{B1}$, where the reading operation of the above ferroelectric memory device can be executed. This simulation is executed assuming both cases when the ferroelectric capacitor 12 is polarized in the second direction and when polarized is in the first direction.

FIG. 10 shows the result of simulation. The curve L is the potential difference ($V_{B1}-V_{B2}$) between $V_{B1}$ and $V_{B2}$ when the ferroelectric capacitor 12 is polarized in the second direction, and the curve R is the potential difference ($V_{B1}-V_{B2}$) between $V_{B1}$ and $V_{B2}$ when the ferroelectric capacitor 12 is polarized in the first direction.

When the ferroelectric capacitor 12 is polarized in the second direction, $V_{B2}$, to be detected, is higher than $V_{B1}$. Therefore, $V_{B1}-V_{B2}$ is a negative value. When the ferroelectric capacitor 12 is polarized in the first direction, $V_{B1}$, to be detected, is higher than $V_{B2}$. Therefore, $V_{B1}-V_{B2}$ is a positive value. According to the curve L in FIG. 10, the potential difference becomes a negative value when $C_{B1}$ is approximately in the $0-2.8 \times 10^{-10}$ F range. According to the curve R, the potential difference becomes a positive value when $C_{B1}$ is approximately in the $3 \times 10^{-11}$ F or more. Therefore, when each capacitance is set as above, data can be accurately read from the ferroelectric memory device with the structure shown in FIG. 5 if $C_{B2}$ is the capacitance in a $3 \times 10^{-11} - 2.8 \times 10^{-10}$ F range.

The settings of each capacitance are not limited to the settings used for this example. In this example, $C_{B1}$ is defined as the reference capacitance, and the applicable range of this capacitance was examined, but another capacitance may be defined as the reference capacitance.

Fourth Configuration Example

As a fourth configuration example, one setting example of each capacitance for reading data from the ferroelectric memory device having the structure shown in FIG. 6 will be described with reference to FIG. 11.

Figure 11:
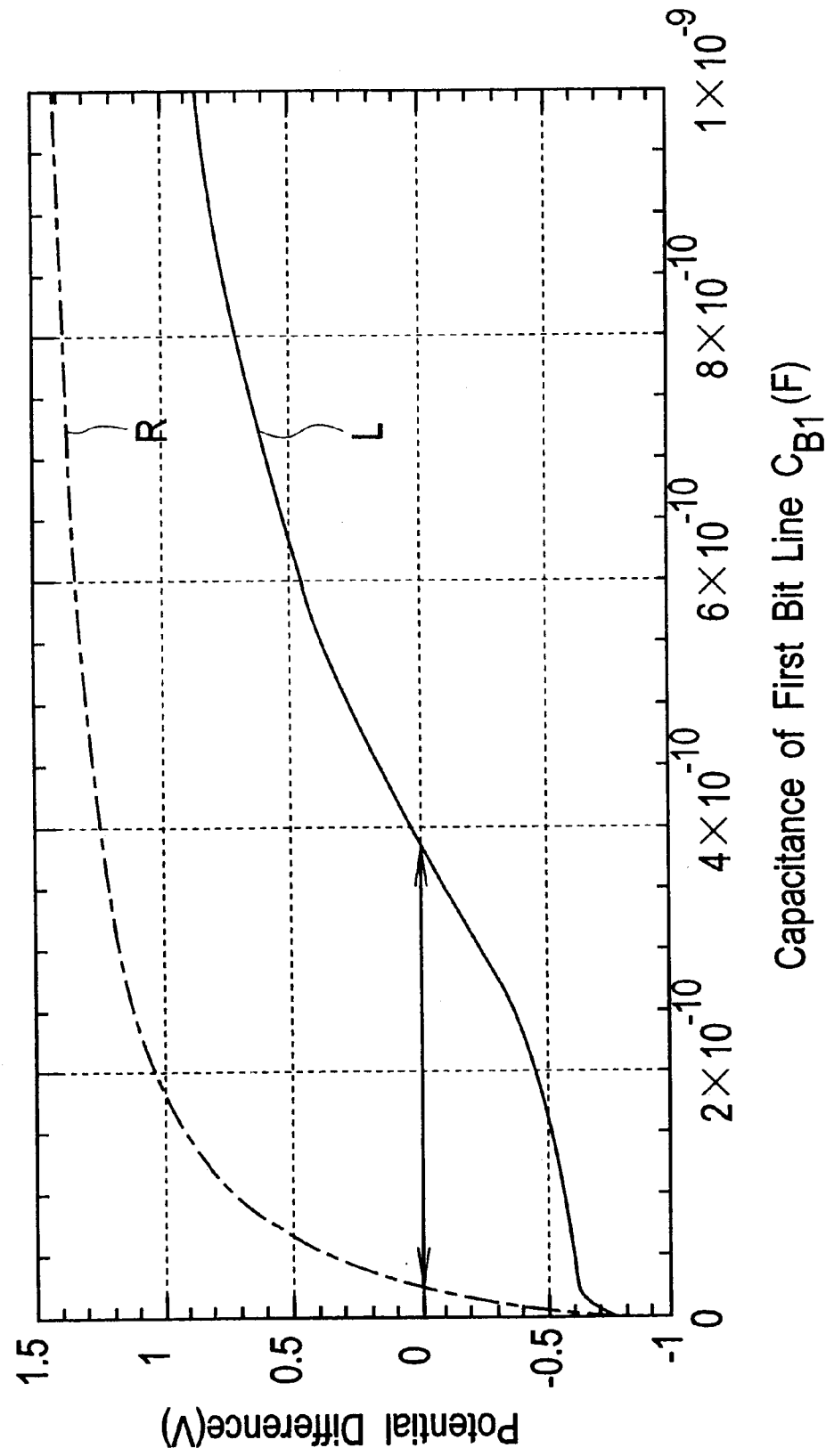
FIG. 11 is a characteristic diagram based on a simulation result depicting the dependency of the potential difference on capacitance to be used for description of the fourth configuration example.
Figure 12:
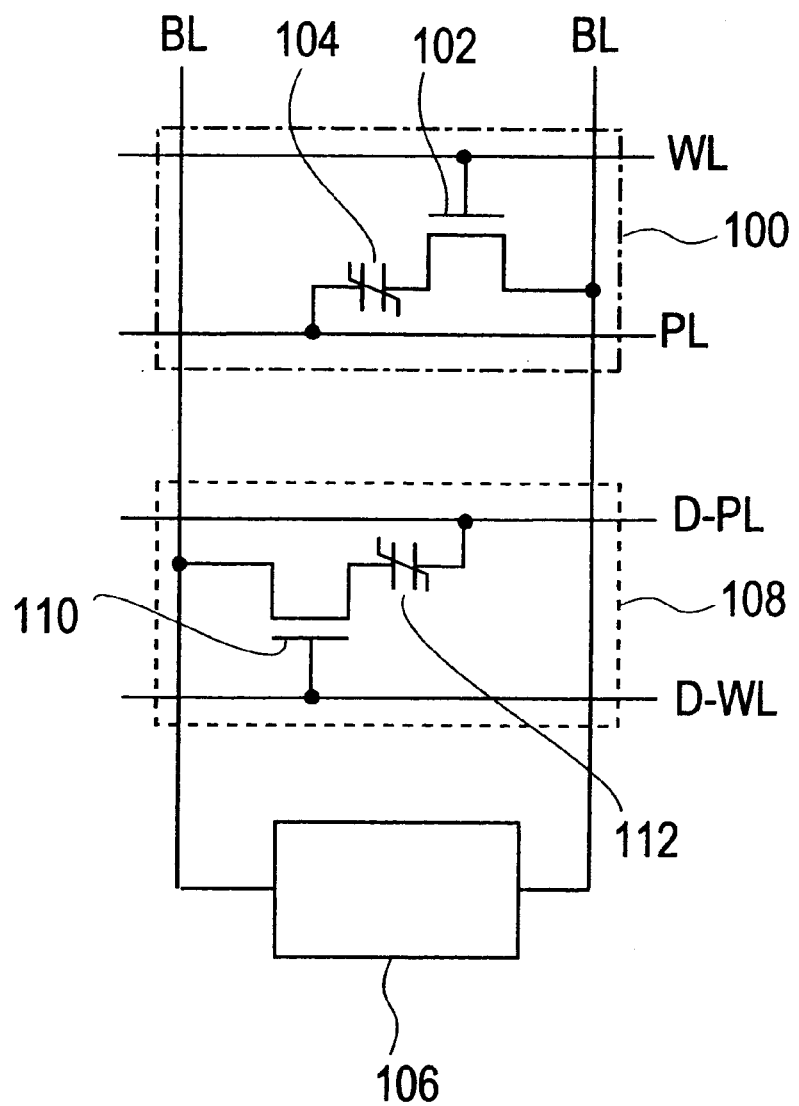
FIG. 12 is a circuit diagram depicting a configuration of a conventional 1T1C type ferroelectric memory device.

FIG. 11 is a characteristic diagram depicting the capacitance dependency of the potential detected by the sense amplifier. In FIG. 11, the abscissa is the capacitance $C_{B1}$ (F) of the first bit line, and the ordinate is the potential difference (V) between the potential $V_{B1}$ of the first bit line BL1 and the potential $V_{B2}$ of the second bit line BL2.

The potential which is actually output from the sense amplifier 18 is the potential $V_{B2}$ of the second bit line and the potential $V_{BS}$ of the sub-bit line, but in this example, the ordinate is the potential difference between $V_{B1}$ and $V_{B2}$, since the potential $V_{BS}$, to be output, and $V_{B1}$ of the first bit line are equal.

In this configuration example, just like the first configuration example, the ferroelectric film of the ferroelectric capacitor 12 is $SrBi_2Ta_2O_9$ film, and the film thickness is 0.2 μm. The power supply voltage is Vcc=3V.

And in this example, the capacitance $C_{B1}$ of the first bit line BL1, the capacitance $C_{B2}$ of the second bit line BL2, and the capacitance $C_{BS}$ of the sub-bit line BLS are set as follows.

$$C_{B1}=C_{B2}=C_{BS}$$

After each capacitance is set in this way, the potential difference between $V_{B1}$ and $V_{B2}$ is simulated while changing $C_{B1}$ from 0 F to $1\times10^{-9}$ F, so as to check the range of $C_{B1}$ where the reading operation of the above ferroelectric memory device can be executed, in the same manner as the third configuration example.

FIG. 11 is the result of the simulation. The curve L is the potential difference ($V_{B1}$-$V_{B2}$) between $V_{B1}$ and $V_{B2}$ when the ferroelectric capacitor 12 is polarized in the second direction, and the curve R is the potential difference ($V_{B1}$-$V_{B2}$) between $V_{B1}$ and $V_{B2}$ when the ferroelectric capacitor 12 is polarized in the first direction.

According to the curve L in FIG. 11, the potential difference becomes a negative value when $C_{B1}$ is approximately in the $0$–$4\times10^{-10}$ F range. According to the curve R, the potential difference becomes a positive value when $C_{B1}$ is approximately in the $3\times10^{-11}$ F range or more. Therefore, when each capacitance is set as above, data can be accurately read from the ferroelectric memory device with the structure shown in FIG. 6 if $C_{B2}$ is the capacitance in the range of $3\times10^{-11}$–$4\times10^{-10}$ F.

The settings of each capacitance are not limited to the settings used for this example. In this example, $C_{B1}$ is defined as the reference capacitance, and the applicable range of this capacitance was examined, but another capacitance may be defined as the reference capacitance.

In all of the ferroelectric memory devices of the above mentioned first to fourth configuration examples, the size of the memory cell 10 is smaller than a 2T2C type ferroelectric memory device. Also, it is unnecessary to include a means for generating the reference potential since generating a reference potential is not necessary when the data is read. Therefore, the integration of the ferroelectric memory device will be as high as a DRAM.

Also, reference voltage is unnecessary when the data is read, so reading errors caused by the fatigue phenomena of the ferroelectric film to be used for generating the reference potential can be prevented. And, the polarization direction of the ferroelectric capacitor 12 can be accurately judged by a completely new method of comparing the potential of the sub-bit line BLS, which is connected with the first bit line BL1 via the capacitor 16 or the switch transistor 30 and the potential of the second bit line BL2.

What is claimed is:

1. A ferroelectric memory device comprising:
   at least one memory cell further comprising one ferroelectric capacitor and a first transistor where one end of a main current path is connected to one electrode of said ferroelectric capacitor;
   a word line connected to a control electrode of said first transistor;
   a first bit line connected to the other end of the main current path of said first transistor;
   a second bit line connected to the other electrode of said ferroelectric capacitor;
   a capacitor connected to said first bit line;
   a sub-bit line connected to an electrode of said capacitor at the side which is not connected to said first bit line; and
   a sense amplifier which detects which one of the potentials of said sub-bit line and said second bit line is higher or lower.

2. A ferroelectric memory device according to claim 1, wherein the capacitance of said first bit line is defined as the first bit line capacitance $C_{B1}$, the capacitance of said second bit line is defined as the second bit line capacitance $C_{B2}$, the capacitance of said capacitor is defined as the capacitor capacitance $C_X$, the capacitance of said sub-bit line is defined as the sub-bit line capacitance $C_{BS}$, and when the data is read from said memory cell, said first bit line, the second bit line and the sub-bit line are set to be the same potential, then said first bit line is pre-charged such that the potential difference between said first bit line and said second bit line becomes a voltage for measurement V, then said first bit line, the second bit line and the sub-bit line are electrically floated, then said word line is activated, so that the electric charge quantity ΔQ of the electric charges is transferred from said first bit line to said second bit line via said ferroelectric capacitor, and at this time said first bit line capacitance $C_{B1}$, the second bit line capacitance $C_{B2}$, the capacitor capacitance $C_X$ and the sub-bit line capacitance $C_{BS}$ are determined so as to satisfy the following formula (1), $$V/\Delta Q_1 < 1/C_{Bt}+1/C_{B2}+C_{BS}/(C_{B2}\cdot C_X) < V/\Delta Q_0 \qquad (1),$$

($C_{Bt}$ in the formula (1) is $C_{Bt}=C_{B1}+(1/C_X+1/C_{BS})^{-1}$)

where $\Delta Q_1$ is said electric charge quantity when the polarization inversion of said ferroelectric capacitor is accompanied and $\Delta Q_0$ is said electric charge quantity when the polarization inversion of said ferroelectric capacitor is not accompanied.

3. A ferroelectric memory device according to claim 1, wherein the other electrode of said ferroelectric capacitor and said second bit line are connected via a main current path of a second transistor, and a control electrode of said second transistor is connected to said word line.

4. A ferroelectric memory device according to claim 3, wherein the capacitance of said first bit line is defined as the first bit line capacitance $C_{B1}$, the capacitance of said second bit line is defined as the second bit line capacitance $C_{B2}$, the capacitance of said capacitor is defined as the capacitor capacitance $C_X$, the capacitance of said sub-bit line is defined as the sub-bit line capacitance $C_{BS}$, and when the data is read from said memory cell, said first bit line, the second bit line and the sub-bit line are set to be the same potential, then said first bit line is pre-charged such that the potential difference between said first bit line and said second bit line becomes a voltage for measurement V, then said first bit line, the second bit line and the sub-bit line are electrically floated, then said word line is activated, so that the electric charge quantity ΔQ of the electric charges is transferred from said first bit line to said second bit line via said ferroelectric capacitor, and at this time said first bit line capacitance $C_{B1}$, the second bit line capacitance $C_{B2}$, the capacitor capacitance $C_X$ and the sub-bit line capacitance $C_{BS}$ are determined so as to satisfy the following formula (1), $$V/\Delta Q_1 < 1/C_{Bt} + 1/C_{B2} + C_{BS}/(C_{B2} \cdot C_X) < V/\Delta Q_0 \quad (1),$$

($C_{Bt}$ in the formula (1) is $C_{Bt} = C_{B1} + (1/C_X + 1/C_{BS})^{-1}$) where $\Delta Q_1$ is said electric charge quantity when the polarization inversion of said ferroelectric capacitor is accompanied and $\Delta Q_0$ is said electric charge quantity when the polarization inversion of said ferroelectric capacitor is not accompanied.

5. A ferroelectric memory device comprising:

at least one memory cell further comprising one ferroelectric capacitor and a first transistor where one end of a main current path is connected to one electrode of said ferroelectric capacitor;

a word line connected to a control electrode of said first transistor;

a first bit line connected to the other end of the main current path of said first transistor;

a second bit line connected to the other electrode of said ferroelectric capacitor;

a switch transistor where one end of a main current path is connected to said first bit line;

a sub-bit line connected to the other end of the main current path of said switch transistor; and a sense amplifier which detects which one of the potentials of said sub-bit line and said second bit line is higher or lower.

6. A ferroelectric memory device according to claim 5, wherein the capacitance of said first bit line is defined as the first bit line capacitance $C_{B1}$, the capacitance of said second bit line is defined as the second bit line capacitance $C_{B2}$, the capacitance of said sub-bit line is defined as the sub-bit line capacitance $C_{BS}$, and when the data is read from the said memory cell, said first bit line, the second bit line and the sub-bit line are set to be the same potential, then said first bit line is pre-charged while said switch transistor is in an inactive state such that the potential difference between said first bit line and said second bit line becomes a voltage for measurement V, then said first bit line, the second bit line and the sub-bit line are electrically floated, then said word line is activated, so that the electric charge quantity $\Delta q$ of the electric charges is transferred from said first bit line to said second bit line via said ferroelectric capacitor, and at this time, said first bit line capacitance $C_{B1}$, the second bit line capacitance $C_{B2}$ and the sub-bit line capacitance $C_{BS}$ are determined so as to satisfy the following formula (2), $$V/\Delta q_1 < (K/C_{B2} + 1/C_{B1}) < V/\Delta q_0 \quad (2)$$

(K in the formula (2) is $K = 1 + C_{BS}/C_{B1}$), where $\Delta q_1$ is said electric charge quantity when the polarization inversion of said ferroelectric capacitor is accompanied, and $\Delta q_0$ is said electric charge quantity when the polarization inversion of said ferroelectric capacitor is not accompanied.

7. A ferroelectric memory device according to claim 5, wherein the other electrode of said ferroelectric capacitor and said second bit line are connected via a main current path of a second transistor, and a control electrode of said second transistor is connected to said word line.

8. A ferroelectric memory device according to claim 7, wherein the capacitance of said first bit line is defined as the first bit line capacitance $C_{B1}$, the capacitance of said second bit line is defined as the second bit line capacitance $C_{B2}$, the capacitance of said sub-bit line is defined as the sub-bit line capacitance $C_{BS}$, and when the data is read from the said memory cell, said first bit line, the second bit line and the sub-bit line are set to be the same potential, then said first bit line is pre-charged while said switch transistor is in an inactive state such that the potential difference between said first bit line and said second bit line becomes a voltage for measurement V, then said first bit line, the second bit line and the sub-bit line are electrically floated, then said word line is activated, so that the electric charge quantity $\Delta q$ of the electric charges is transferred from said first bit line to said second bit line via said ferroelectric capacitor, and at this time, said first bit line capacitance $C_{B1}$, the second bit line capacitance $C_{B2}$ and the sub-bit line capacitance $C_{BS}$ are determined so as to satisfy the following formula (2), $$V/\Delta q_1 < (K/C_{B2} + 1/C_{B1}) < V/\Delta q_0 \quad (2)$$

(K in the formula (2) is $K = 1 + C_{BS}/C_{B1}$), where $\Delta q_1$ is said electric charge quantity when the polarization inversion of said ferroelectric capacitor is accompanied, and $\Delta q_0$ is said electric charge quantity when the polarization inversion of said ferroelectric capacitor is not accompanied.

9. A data reading method used when data of a memory cell where writing is completed is read from a ferroelectric memory device comprising at least one memory cell further comprising one ferroelectric capacitor and a first transistor where one end of a main current path is connected to one electrode of said ferroelectric capacitor, a word line connected to a control electrode of said first transistor, a first bit line connected to the other end of the main current path of said first transistor, a second bit line connected to the other electrode of said ferroelectric capacitor, a capacitor connected to said first bit line, a sub-bit line connected to an electrode of said capacitor at the side which is not connected to said first bit line, and a sense amplifier which detects which one of the potentials of said sub-bit line and said second bit line is higher or lower, comprising the steps of:

setting the first bit line, the second bit line and the sub-bit line to be the same potential;

pre-charging said first bit line such that the potential difference between said first bit line and said second bit line become the voltage for measurement, then electrically floating said first bit line, the second bit line, and the sub-bit line;

activating said word line; and activating said sense amplifier and detecting which one of the potentials of said sub-bit line and said second bit line is higher or lower.

10. A data reading method according to claim 9, wherein the other electrode of said ferroelectric capacitor and said second bit line are connected via a main current path of a second transistor, and a control electrode of said second transistor is connected to said word line.

11. A data reading method according to claim 9, wherein when the polarization direction of said ferroelectric capacitor is inverted after the detection step by said sense amplifier, a step of restoring of said polarization direction using an output potential from said sense amplifier is included.

12. A data reading method according to claim 11, wherein the other electrode of said ferroelectric capacitor and said second bit line are connected via a main current path of a second transistor, and a control electrode of said second transistor is connected to said word line.

13. A data reading method used when data of a memory cell where writing is completed is read from a ferroelectric memory device comprising at least one memory cell further comprising one ferroelectric capacitor and a first transistor where one end of a main current path is connected to one electrode of said ferroelectric capacitor, a word line connected to a control electrode of said first transistor, a first bit line connected to the other end of the main current path of said first transistor, a second bit line connected to the other electrode of said ferroelectric capacitor, a switch transistor where one end of a main current path is connected to said first bit line, a sub-bit line connected to the other end of the main current path of said switch transistor, and a sense amplifier which detects which one of the potentials of said sub-bit line and said second bit line is higher or lower, comprising steps of:

setting the first bit line, the second bit line and the sub-bit line to be the same potential;

pre-charging said first bit line such that the potential difference between said first bit line and said second bit line become the voltage for measurement, then electrically floating said first bit line, the second bit line and the sub-bit line;

activating said word line;

deactivating said word line then activating said switch transistor; and activating said sense amplifier and detecting which one of the potentials of said sub-bit line and said second bit line is higher or lower.

14. A data reading method according to claim 13, wherein the other electrode of said ferroelectric capacitor and said second bit line are connected via a main current path of a second transistor, and a control electrode of said second transistor is connected to said word line.

15. A data reading method according to claim 13, wherein when the polarization direction of said ferroelectric capacitor is inverted after the detection step of said sense amplifier, a step of restoring said polarization direction using an output potential from said sense amplifier is included.

16. A data reading method according to claim 15, wherein the other electrode of said ferroelectric capacitor and said second bit line are connected via a main current path of a second transistor, and a control electrode of said second transistor is connected to said word line.

* * * * *